United States Patent
Woolaway et al.

(10) Patent No.: US 6,344,651 B1
(45) Date of Patent: Feb. 5, 2002

(54) DIFFERENTIAL CURRENT MODE OUTPUT CIRCUIT FOR ELECTRO-OPTICAL SENSOR ARRAYS

(75) Inventors: James T. Woolaway, Goleta; William J. Parrish, Santa Barbara; Stephen H. Black, Buellton, all of CA (US)

(73) Assignees: Indigo Systems Corporation, Santa Barbara, CA (US); Raytheon Company, Lexington, MA (US)

(*) Notice: Subject to any disclaimer, the term of this patent is extended or adjusted under 35 U.S.C. 154(b) by 0 days.

(21) Appl. No.: 09/427,645

(22) Filed: Oct. 27, 1999

Related U.S. Application Data

(60) Provisional application No. 60/130,202, filed on Apr. 20, 1999.

(51) Int. Cl.[7] .................................. H03F 3/45; G01J 5/24
(52) U.S. Cl. ............... 250/370.08; 250/332; 250/338.4; 327/56; 327/77; 327/89; 327/563; 330/252; 330/253; 330/257; 330/308
(58) Field of Search ................................. 330/252, 253, 330/257, 277, 288, 308; 327/52, 53, 56, 77, 89, 563; 250/332, 338.4, 370.08

(56) References Cited

U.S. PATENT DOCUMENTS

| | | | | |
|---|---|---|---|---|
| 5,329,115 A | * | 7/1994 | Lim ........................ | 250/214 R |
| 5,483,194 A | * | 1/1996 | Genest ..................... | 330/253 |
| 5,696,456 A | * | 12/1997 | Lee ......................... | 326/70 |

* cited by examiner

Primary Examiner—Constantine Hannaher
(74) Attorney, Agent, or Firm—William C. Schubert; Glenn H. Lenzen, Jr.

(57) ABSTRACT

A differential current mode amplifier circuit (5,5') includes a first circuit leg having a first current source providing a current I1 coupled in series with a first transistor (m1) at a first circuit node (n1). The first transistor has a control terminal for coupling to an input signal potential (Vs). Vs is obtained from a unit cell of a radiation detector array, and is indicative of a magnitude of an integrated, photon-induced charge. The first circuit leg outputs a first output current (Is). A second circuit leg includes a second current source providing a current I2 coupled in series with a second transistor (m2) at a second circuit node (n2). The second transistor has a control terminal for coupling to an input reference potential (Vr). The second circuit leg outputs a second output current (Ir). A resistance (Rs) is coupled between the first circuit leg and the second circuit leg at the first circuit node and the second node. The current flow through Rs is proportional to a difference between Vs and Vr, and is thus indicative of a magnitude of Vs.

20 Claims, 22 Drawing Sheets

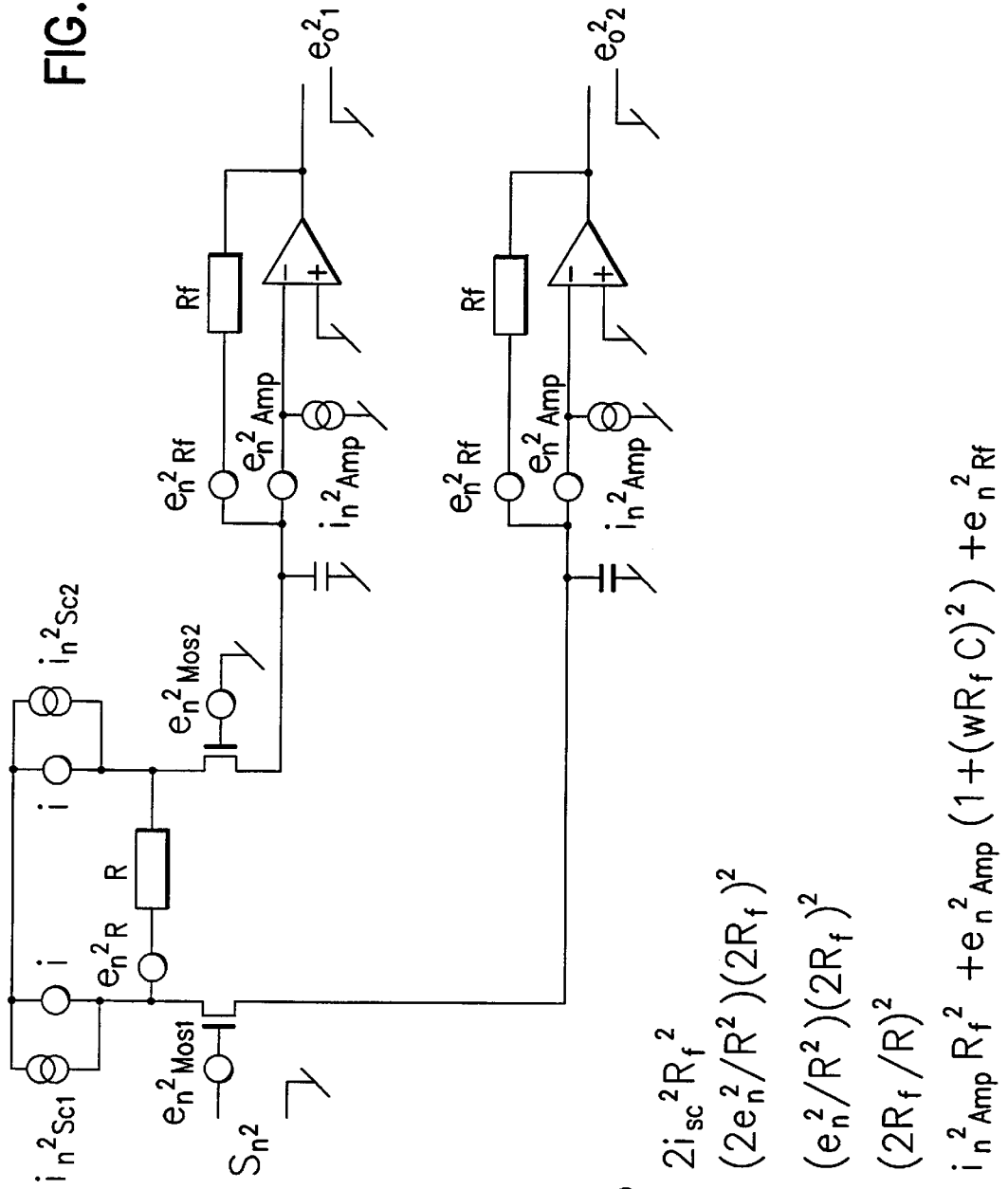

DIFFERENTIAL CURRENT MODE OUTPUT CIRCUIT FOR ELECTRO-OPTICAL SENSOR ARRAYS

CLAIM OF PRIORITY FROM A COPENDING PROVISIONAL PATENT APPLICATION

Priority is herewith claimed under 35 U.S.C. §119(e) from copending Provisional Patent Application 60/130,202, filed Apr. 20, 1999 with Express Mail No.: EL294725341US, entitled "Differential Current Mode Output Circuit", by James T. Woolaway II, William J. Parrish and Stephen H. Black. The disclosure of this Provisional Patent Application is incorporated by reference herein in its entirety.

FIELD OF THE INVENTION

This invention pertains generally to electronic circuitry for use with solid state electro-optical sensors of electromagnetic radiation, such as infrared (IR) sensors, and more particularly pertains to an output circuit usable with a focal plane array (FPA) of IR sensors, such as a scanned IR-FPA and a staring IR-FPA, both cooled and uncooled.

BACKGROUND OF THE INVENTION

In modern electro-optical sensor systems, solid-state electronic devices are used to perform the function of sensing incident radiation at the image plane of the system, integrating this signal, multiplexing the integrated signal, and then driving the signal to the system's electronics. Examples of such solid-state electronic devices are the visible CMOS and charge-coupled devices (CCDs) used in video cameras, as well as the IR-FPAs that are used in many civilian and military systems.

With most modern electro-optical sensors it is desirable to increase the output signal bandwidth and the data rate while reducing the power dissipated in the output circuitry. This is in part due to the increasing size, pixel count, and frame-rate that are characteristic of modern electro-optical sensors.

In so-called second generation IR-FPAs, two principal component materials are used to fabricate the devices. These are the incident radiation sensing detector material and the readout integrated circuit material. The detector material is chosen and optimized for sensing specific incident radiation wavelengths of interest, while the readout integrated circuit material is selected for its properties in realizing the desired signal processing and multiplexing functions.

FIG. 1 illustrates a conventional scanning IR-FPA 1. The two principal components are shown, i.e., the infrared detector array 2 and the scanning readout multiplexer 3. Incident radiation on the material of the detector array 2 generates a response in the detector material. This response is sensed, integrated, signal processed, multiplexed, and buffered by the scanning readout multiplexer 3. Suitable materials for fabricating the detector 2 may be Group III–V materials, such as InSb, or Group II–VI materials, such as HgCdTe, or other material types. Silicon-based technology is generally used to support the design and fabrication of the readout multiplexer 3. In the case of the scanning readout multiplexer 3, the image to be sensed is scanned across the surface of the detector array 2 and a line or series of lines is sensed at any given time. The image is therefore composed of a plurality of lines that are acquired over a period of time.

FIG. 2 illustrates a conventional staring-type of IR-FPA 1'. As in the case of the scanning IR-FPA 1 of FIG. 1, the infrared detector material 2 is mated to a readout multiplexer, in this case a staring-type readout multiplexer 3'. The staring IR-FPA 1' differs from the scanning IR-FPA 1 in that at least a portion of all of the lines of the image can be sensed at one time. Thus, it is not necessary for the image to be scanned across the array 2.

In currently available state-of-the-art voltage mode IR-FPA output circuits, parasitic output capacitance limits the ability of the output (voltage mode) amplifier to slew and settle the output signal level at high frequencies. As a result, an increase in current is required to slew the output capacitance in order to obtain higher output signal bandwidths. In a related manner, lower impedance output MOS drivers are required to settle the output capacitance. Additional limitations in voltage mode output amplifiers arise at high output frequencies. These additional limitations arise due to the fact that as the signal frequency reaches the bandwidth limit of the amplifier, the amplifier experiences a significant reduction in the rejection of undesirable signals coupled from the power supply. For some electro-optical sensor applications many output amplifiers are required to support a total required output data bandwidth. In these cases the reduced power supply rejection can create problems, as the amplifiers may cross-talk to one another through the power supplies. Such cross-talk results typically in an objectionable degradation of the image quality obtained from the IR-FPA.

OBJECTS AND ADVANTAGES OF THE INVENTION

It is a first object and advantage of this invention to provide an improved IR-FPA that overcomes the foregoing and other problems.

It is a further object and advantage of this invention to provide an electro-optical sensor that has at least one differential current mode output amplifier that improves the overall signal bandwidth, power dissipation and power supply rejection characteristics of the electro-optical sensor readout electronics.

SUMMARY OF THE INVENTION

The foregoing and other problems are overcome and the objects and advantages are realized by methods and apparatus in accordance with embodiments of this invention.

In one aspect the teachings of this invention provide a novel current mode output amplifier circuit that generates a differential current output signal for electro-optical sensor arrays. The novel differential current mode output amplifier and related circuitry disclosed herein can readily provide at least a two to four times speed advantage over conventional voltage mode output stages, while operating at the same or lower power levels.

The teachings of this invention thus pertain to a circuit topology that provides a differential current output signal for electro-optical sensors. The described circuitry provides improved performance in the areas of signal bandwidth, power dissipation and supply rejection. The differential current mode output approach is well suited for use in wide bandwidth, low power applications, and is particularly well suited for those applications where a plurality of output amplifiers are required on a single electro-optical sensor.

The teachings of this invention have application to all types of electro-optical sensor arrays, particularly for those arrays where a wide bandwidth, low power, and multiple output amplifiers are required, and provides an important enabling technology for large-format, high-speed, low-power electro-optical sensors, such as advanced IR-FPAs.

In a further aspect the teachings of this invention pertain to readout integrated circuits (ROICs) as well as to electro-optical sensor arrays that are constructed so as to include at least one current mode output amplifier circuit that generates a differential current output signal.

A differential current mode amplifier circuit in accordance with the teachings of this invention includes a first circuit path or leg having a first current source providing a current I1 coupled in series with a first transistor (m1) at a first circuit node (n1). The first transistor has a control terminal for coupling to an input signal potential (Vs). Vs is obtained, by any suitable means, from a unit cell of a radiation detector array, and is indicative of a magnitude of photon-induced charge. The photons may be thermal (IR) photons, or visible light photons, or photons in other portions of the spectral band, such as the ultraviolet (UV). The first circuit leg outputs a first output current (Is). A second circuit path or leg includes a second current source providing a current I2 coupled in series with a second transistor (m2) at a second circuit node (n2). The second transistor has a control terminal for coupling to an input reference potential (Vr). The second circuit leg outputs a second output current (Ir). A resistance (Rs) is coupled between the first circuit leg and the second circuit leg at the first circuit node and the second node. The current flow through Rs is proportional to a difference between Vs and Vr, and is thus indicative of a magnitude of Vs.

An IR-FPA in accordance with the teachings of this invention includes an array of IR responsive photodetectors and a readout integrated circuit (ROIC) that is coupled to the array. The ROIC includes at least one differential current mode amplifier output circuit having a first input for inputting a first potential Vs that represents, at a particular time, a signal output from one of the IR responsive photodetectors. A second input of the at least one differential current mode amplifier output circuit is for inputting a second potential Vr that represents a reference potential. The at least one differential current mode amplifier output circuit outputs first and second currents, wherein a difference between the first and second currents is indicative of a difference between Vs and Vr. Other circuitry, such as a differential analog to digital converter fed by transimpedance amplifiers, can be employed to convert the difference in currents to digital values representing the output signals from the photodetectors.

BRIEF DESCRIPTION OF THE DRAWINGS

The above set forth and other features of the invention are made more apparent in the ensuing Detailed Description of the Invention when read in conjunction with the attached Drawings, wherein:

FIG. 17 is a depiction of the noise model for the differential current mode output amplifier in accordance with the teachings of this invention, and FIG. 18 shows the noise model equations.

DETAILED DESCRIPTION OF THE INVENTION

Figure 1:
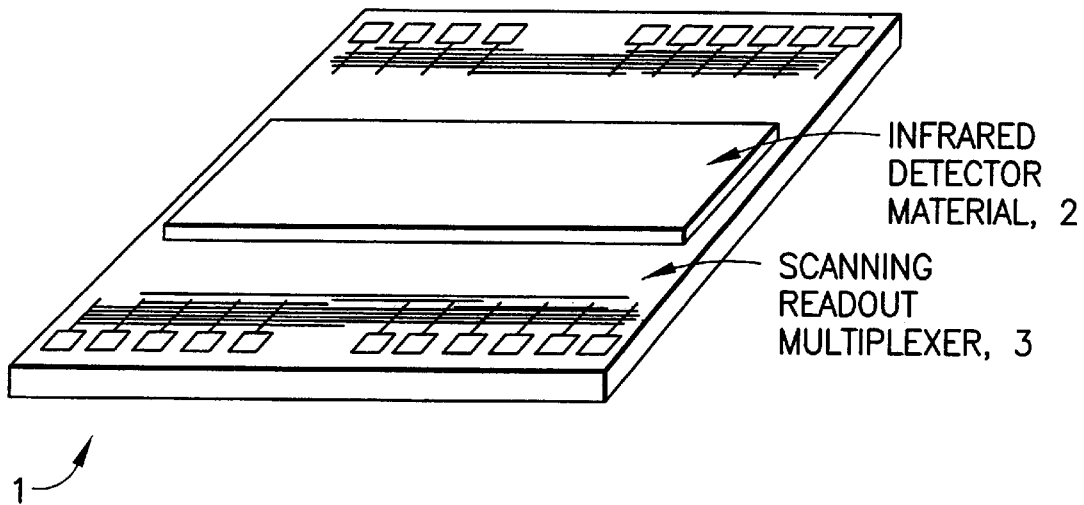
FIG. 1 is an illustration of a conventional scanning infrared focal plane array.
Figure 2:
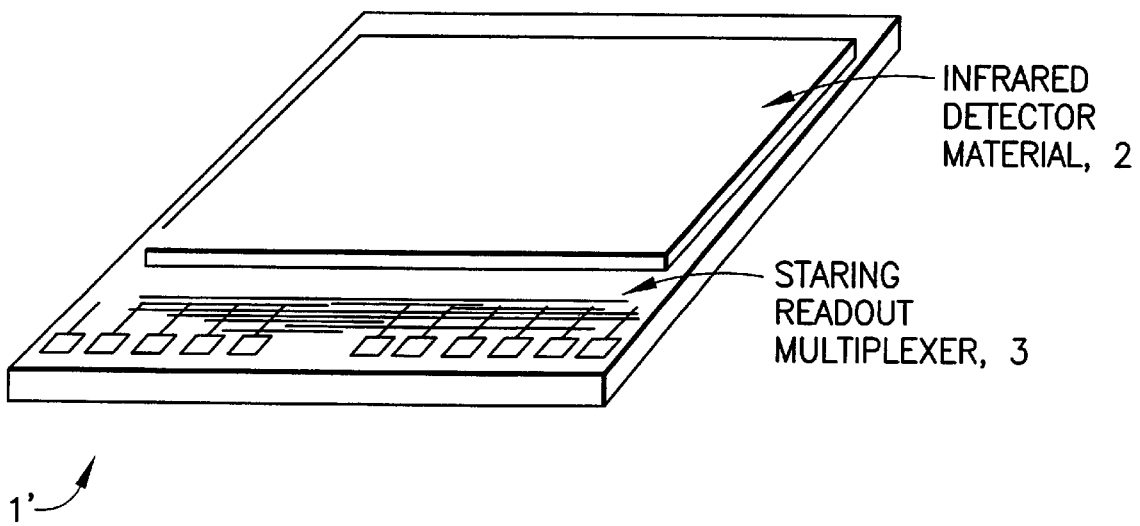
FIG. 2 is an illustration of a conventional staring infrared focal plane array.

It is first noted that in the context of the scanning and staring IR-FPAs 1 and 1' of FIGS. 1 and 2, respectively, there are two classes of IR-FPAs that can be considered for the incorporation of the differential current mode output amplifier in accordance with this invention. These classes are the un-cooled and the cooled sensors. Uncooled sensors may be operated at room or ambient temperature, while cooled sensors are operated with some type of cooling system, such as cryogenic cooling system that employs liquid nitrogen (77K). These sensors differ principally in the type and temperature of the detector material 2 used on the sensor. However, the basic components of the readout integrated circuit (ROIC) are the same for both classes and, as such, the differential current mode output amplifier configurations described in detail below are applicable to both the cooled and un-cooled classes of IR-FPA devices, as well as other types of electro-optical sensor types.

Figure 3:
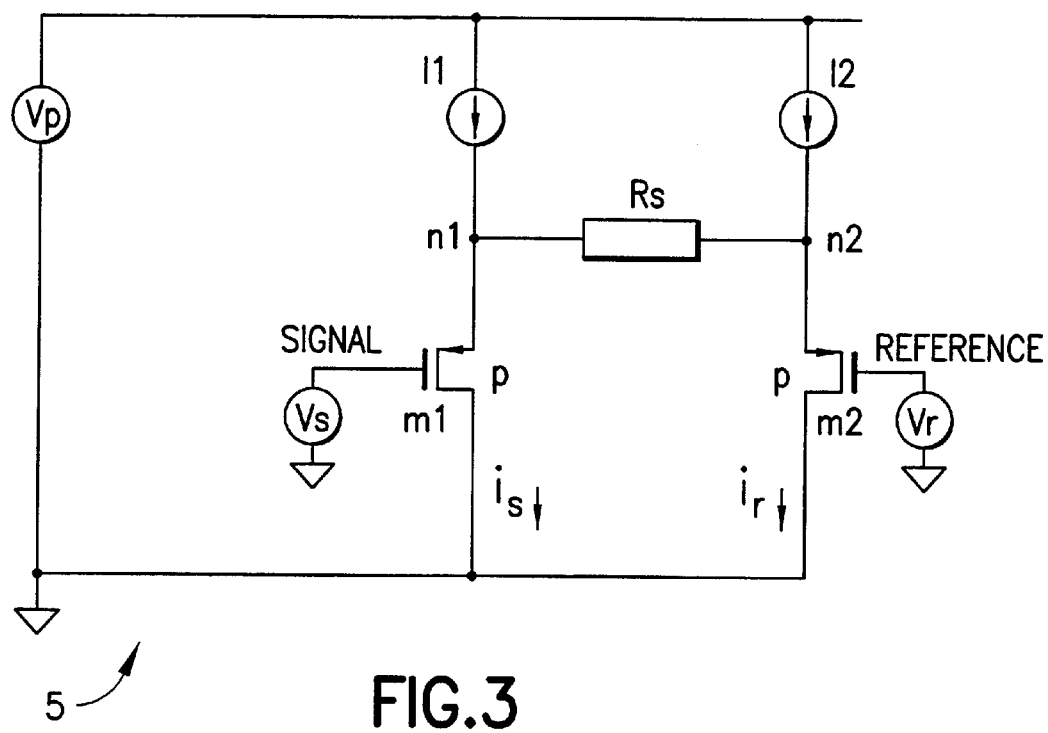
FIG. 3 is an illustration of a differential current generator using p-channel MOSFETs in accordance with an embodiment of this invention.

FIG. 3 illustrates the basic configuration for a p-channel differential current mode output stage 5 in accordance with an embodiment of this invention. The circuit 5 includes two p-channel MOSFET devices (m1, m2) a resistor (Rs) and two current sources (I1, I2). Two inputs are supplied to the circuit, specifically a signal input (Vs) and a reference signal (Vr). Rs is coupled between the source of m1 and the source of m2 at nodes (n) n1 and n2, respectively. Vp represents the power supply potential.

For the purpose of describing the operation of the circuit 5, first consider that the resistor Rs is not present. In this case MOSFET m1, in combination with current source I1, would be described as a source follower circuit. The signal at the gate of m1, or "signal", would be followed at the source of the MOSFET m1 (node n1) with a potential equal to the signal potential plus the absolute value of the threshold (to first order) of the MOSFET m1. The same would be true for the circuit leg comprised of MOSFET m2 and current source I2. Here the "Reference" would be followed at the source of the MOSFET m2 (node n2) with a potential equal to the reference potential plus the absolute value of the threshold (to first order) of the MOSFET m2. The two source follower legs described thus provide the signals "Signal" and "Reference", each with an additional MOSFET threshold, at n1 and n2, respectively.

With resistor Rs removed from the circuit current I1 and I2 can only flow through MOSFETs m1 and m2, respectively. In this condition the currents in the drains of m1 and m2 are equal to the currents from I1 and I2, respectively.

However, when the resistor Rs is connected between the nodes n1 and n2, as shown in FIG. 3, then the difference in potential between n1 and n2 causes a current to flow through resistor Rs. Since the only currents sourcing the nodes n1 and n2 are from the current sources I1 and I2, the current flowing through Rs subtracts from and adds to the currents I1 and I2 flowing through MOSFETS m1 and m2, respectively.

The current flow through resistor Rs is described by Ohms law as:

$$I(Rs)=((V(\text{Signal})+|V(Vtp)|-V(\text{Reference})+|V(Vtp)|)/Rs$$

$$I(Rs)=(V(\text{Signal})-V(\text{Reference}))/Rs$$

The current through Rs is therefore proportional to the difference between the signal potential (Vs) and the reference potential (Vr). The current flow through m1 is equal to the combined currents I1−I(Rs). Similarly, the current through m2 is equal to the combined currents I2+I(Rs). It should be noted that I(Rs) subtracts from node n1 and adds to node n2. Since the current flow out of the lower leg of n1 flows through m1, and the current flow out of the lower leg of n2 flows through m2, the current I(Rs) appears as a difference current through m1 and m2. As such, Is and Ir can be considered as currents contained in a differential current component I(Rs).

Figure 4:
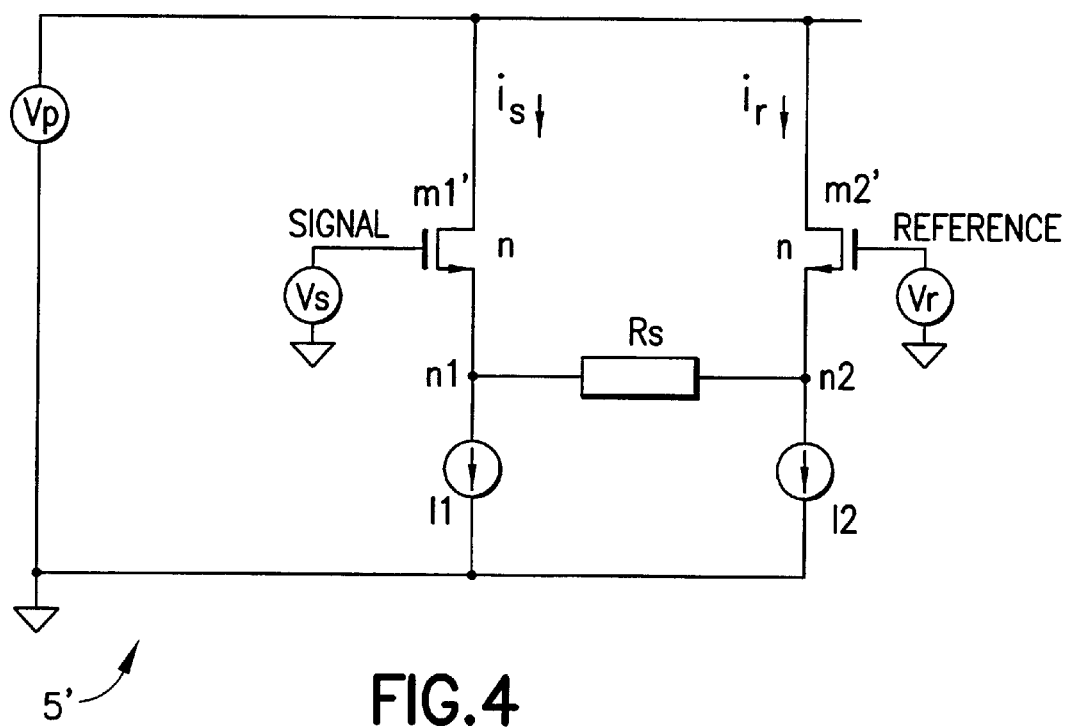
FIG. 4 is an illustration differential current generator using n-channel MOSFETs in accordance with another embodiment of this invention.

FIG. 4 shows a circuit 5' using n-channel MOSFETs m1' and m2'. The n-channel circuit operational principles are identical, however, to those described above, and the currents Is and Ir are now available at the positive supply as compared to the p-channel configuration where the signal currents are available at the negative supply.

It should be noted that the choice of the p-channel or the n-channel configuration for the drivers is primarily determined by the process well configuration. More specifically, for CMOS processes using a p-substrate and an n-well the use of the p-channel topology allows the "source-followers" to be body connected. Similarly, the use of an n-substrate with p-wells enables the n-channel configuration to be body connected. The use of body connected drivers allows the circuit to operate with a higher linearity, and is thus desirable. It should be further noted that the p-channel configuration could be implemented in a p-well embodiment, and that the n-channel configuration could be implemented in an n-well embodiment. It should also be realized that in the ensuing discussion the p-channel circuit 5 and the n-channel circuit 5' can be employed interchangeably, and that should a reference be made specifically to one embodiment, for example as in FIG. 26 where the n-channel circuit 5' is employed, that in general the other embodiment can be substituted therefor and used as well.

Figure 5:
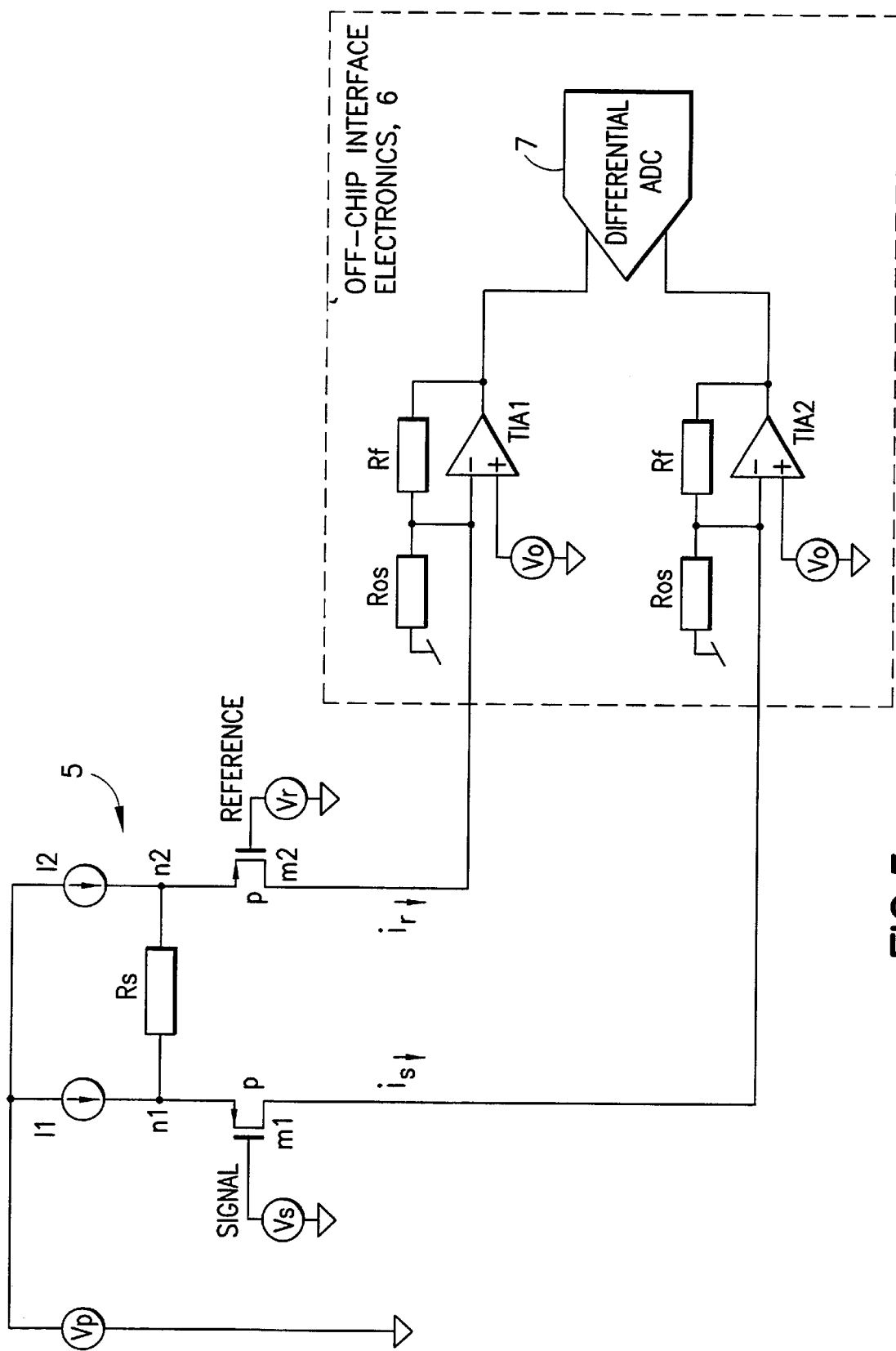
FIG. 5 is an illustration of the p-channel differential current mode output amplifier, and which further shows off-chip interface transimpedance amplifiers and an off-chip differential analog to digital converter (ADC).

As such, and in accordance with the teachings of this invention, the circuit topologies of FIGS. 3 and 4 are used to support a differential current mode output for electro-optical sensors. FIG. 5 illustrates the output interface for the p-channel circuit 5 shown in FIG. 3. Here the currents Is and Ir are output from the electro-optical sensor to (off-chip) interface electronics 6. Transimpedance amplifiers TIA1 and TIA2, shown with feedback resistors Rf, receive the currents Is and Ir. The signal (TIA2) and reference (TIA1) transimpedance amplifiers operate so as to maintain a constant input potential while providing a buffered output voltage that is the function of the magnitude of Is and Ir.

In other words, Is is input to one transimpedance amplifier, Ir is input to another transimpedance amplifier, and a voltage output of each of the transimpedance amplifiers is input to the differential analog to digital converter 7 that then outputs a digital indication of the magnitude of Vs, which is the desired result.

The resistors Ros shown in FIG. 5 can be used to trim the output voltages for the TIAs, buffering the sensor output currents Is and Ir, into the range desired for a differential ADC 7. Vo represents a desired offset potential.

Figure 6:
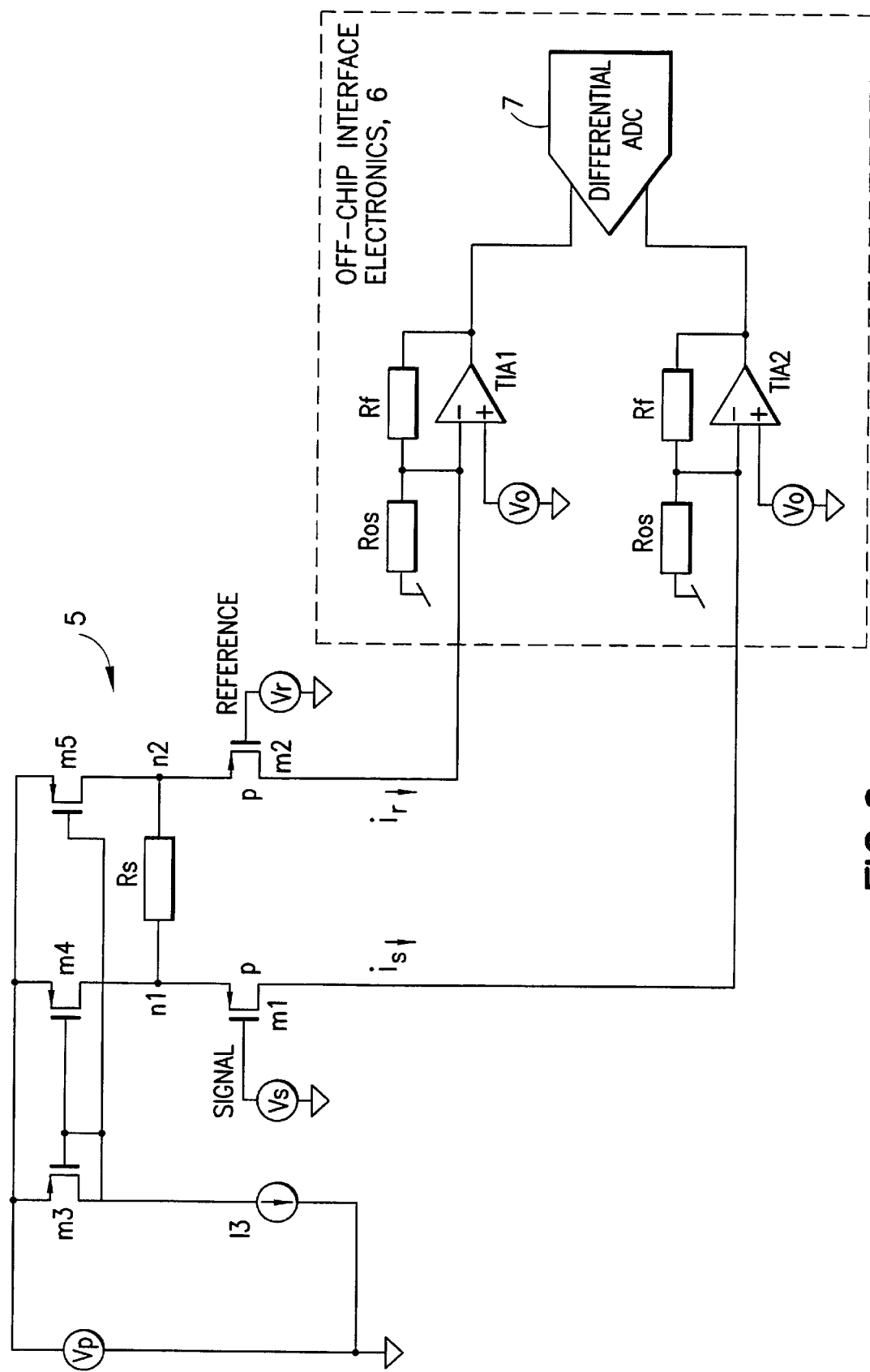
FIG. 6 is an illustration of the p-channel differential current mode output amplifier of FIG. 3 showing current source generation, and which further shows the off-chip interface transimpedance amplifiers and the off-chip differential ADC.

FIGS. 3–5 show idealized current sources I1 and I2 that are used to supply the currents to Rs and the n-channel or p-channel drivers. FIG. 6 illustrates the use of two p-channel MOSFETs m4 and m5 to perform the current source function. The P-channel MOSFET m3 is configured as a current mirror to provide the reference gate voltages to m4 and m5. Current source I3 is shown supplying reference current to the P-channel current mirror m3.

Figure 7:
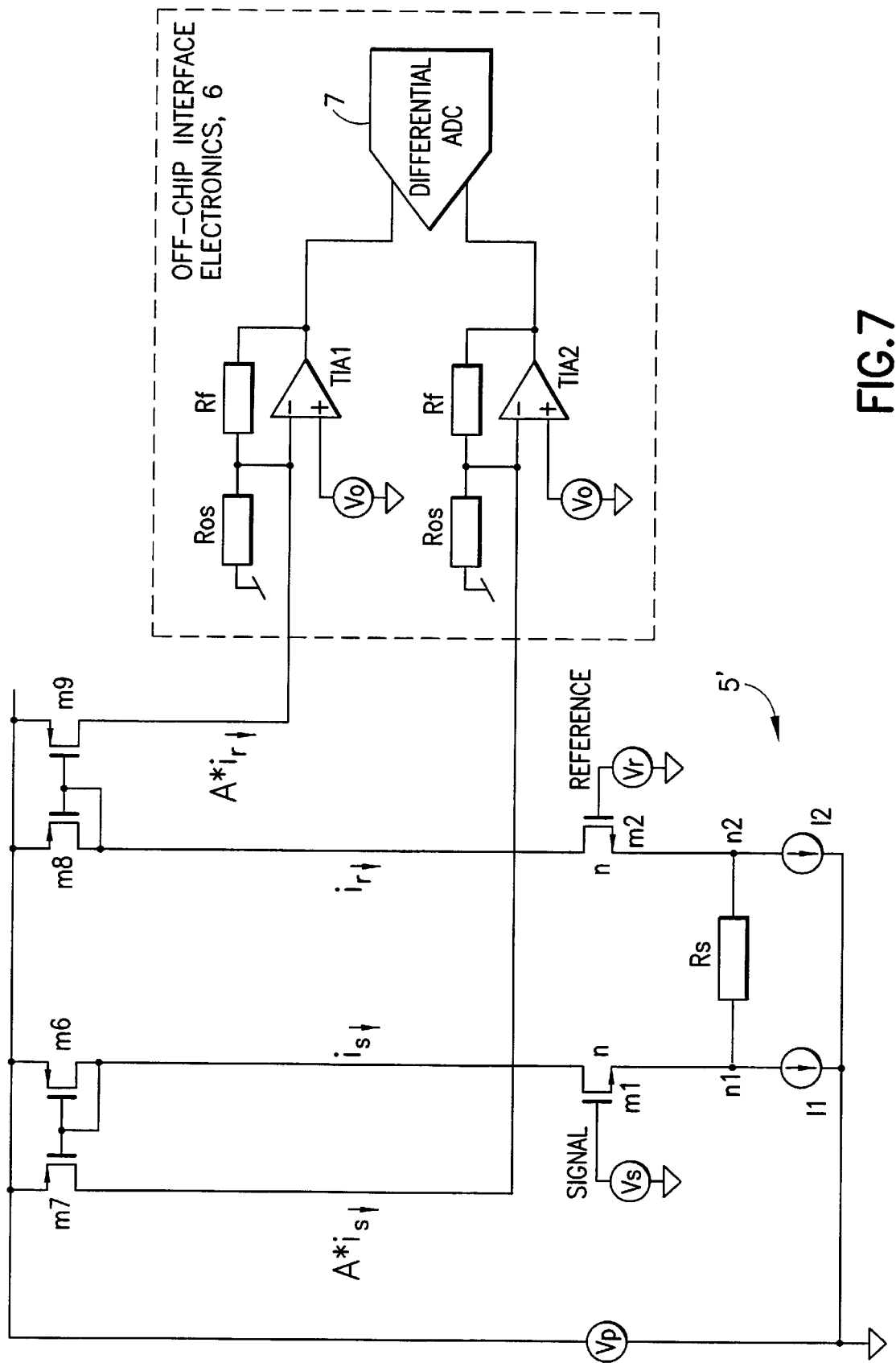
FIG. 7 shows the n-channel differential current mode output amplifier of FIG. 4, and further shows a current mirror, the off-chip interface transimpedance amplifiers, and the off-chip differential ADC.

FIG. 7 illustrates an n-channel configuration for the differential current mode output circuit 5' (FIG. 4). In this case the n-channel MOSFET drivers m1 and m2 are configured with resistor Rs to provide the differential currents Is and Ir. P-channel current mirrors formed by the combination of m6, m7 and m8, m9 are supplied to provide a multiplication factor (A) for the currents Is and Ir. The differential interface currents can be increased or decreased by the multiplication factor (A) provided by the width to length (W/L) ratio of the MOSFETs m6, m7 and m8, m9. The use of current mirrors to increase or decrease the differential output currents (A*is, A*ir) can be useful, as it allows the ohmic value of resistor Rs to be larger, thereby increasing the linearity of the difference circuit, while also lowering power dissipation.

Figure 8:
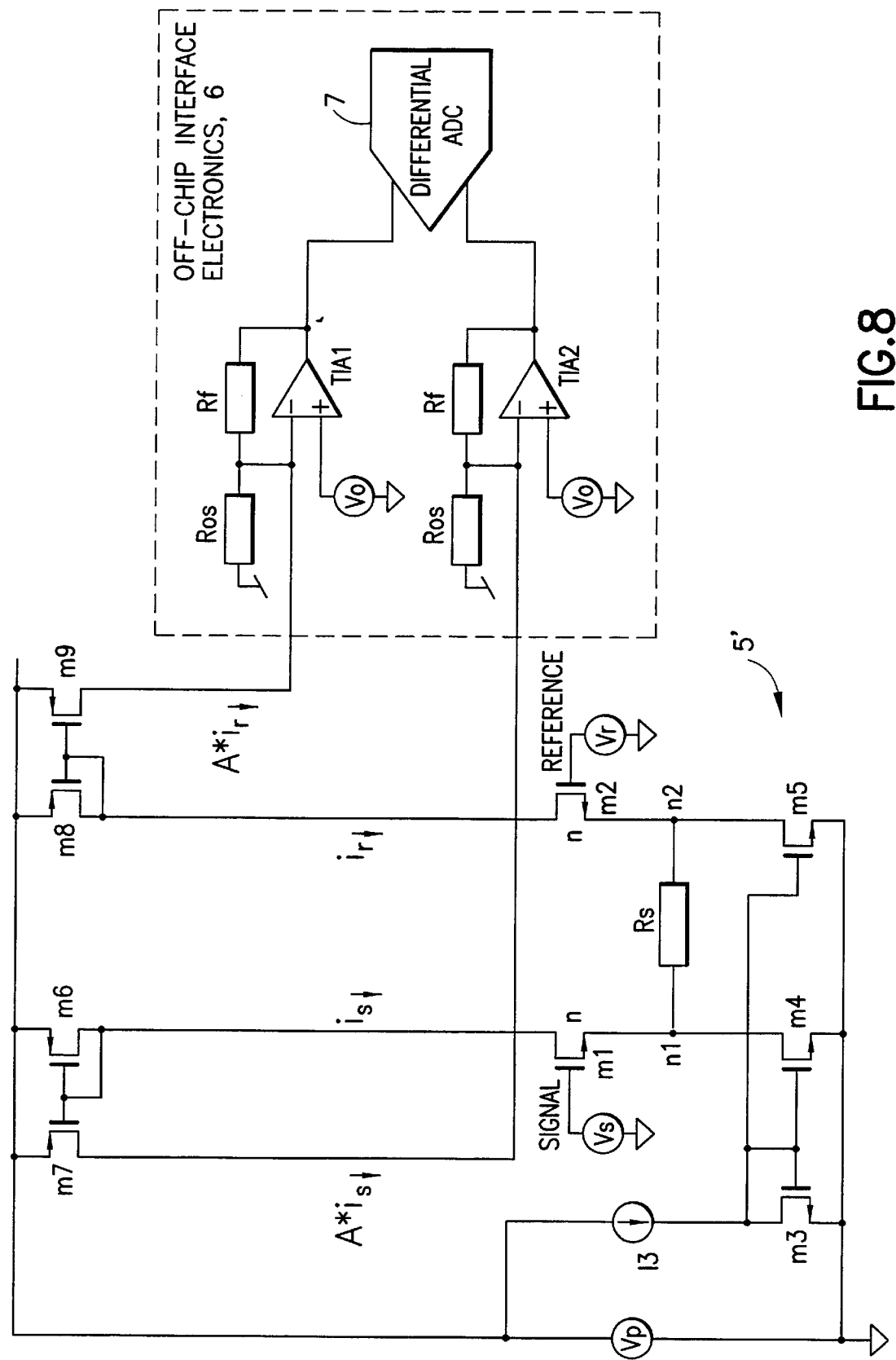
FIG. 8 shows the p-channel differential current mode output amplifier with current source generation, current mirror, off-chip interface transimpedance amplifiers, and the off-chip differential ADC.

FIG. 8 illustrates the use of n-channel MOSFETs m3, m4 and m5 for implementing the current sources I1 and I2 in FIG. 7. MOSFET m3 is used to supply a current mirror to m4 and m5. The current reference I3 supplies the reference current to the mirror m3.

Figure 9:
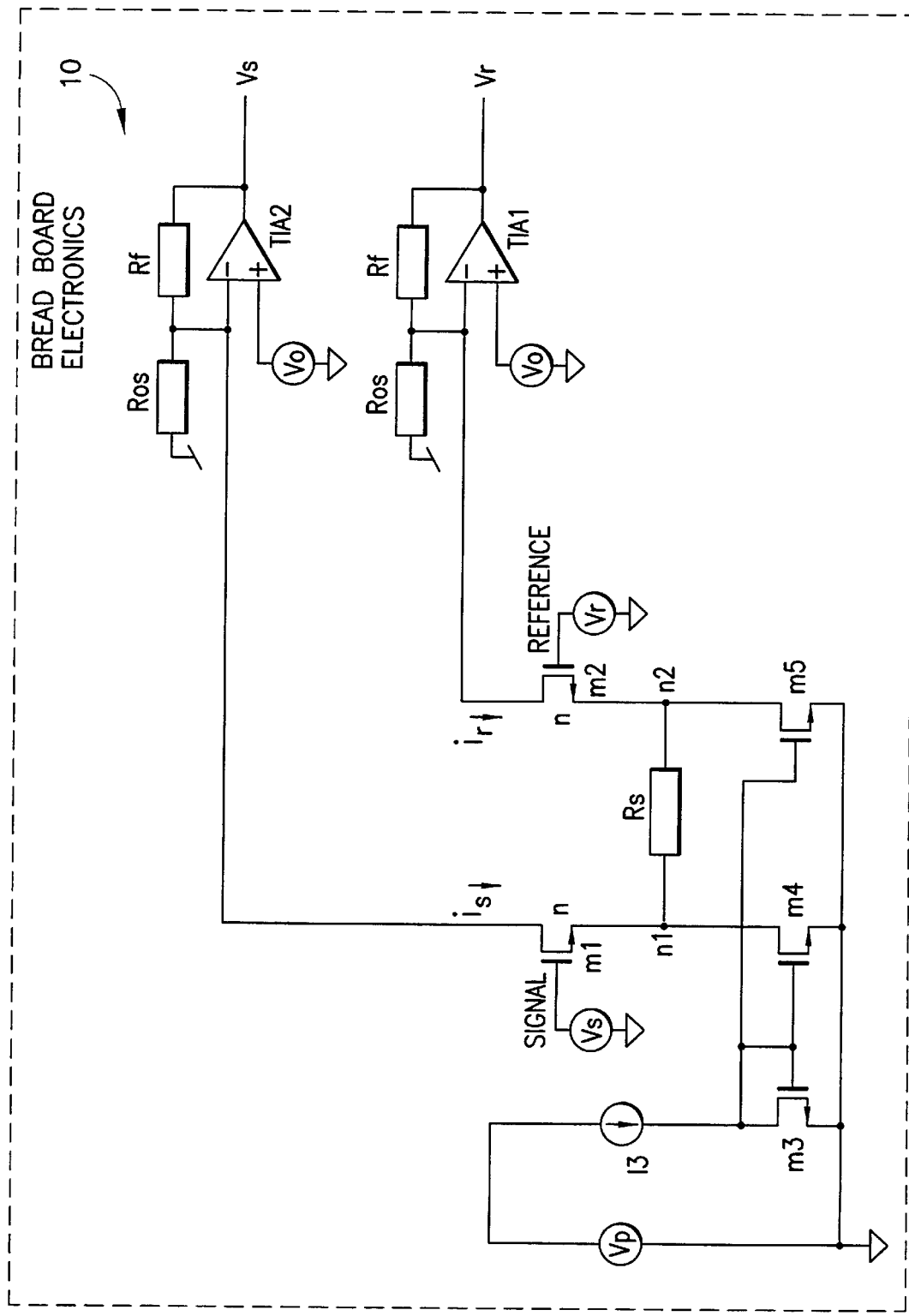
FIG. 9 depicts a bread-board version of the n-channel differential current mode output amplifier with off-chip interface transimpedance amplifiers.

For the purposes of demonstrating the described circuits, a breadboard was constructed using discrete components. A schematic diagram for the breadboard circuit 10 is illustrated in FIG. 9. Discrete n-channel FETs were used for the current mirror m3, and the current sources m4 and m5. The mirrored currents into m4 and m5 were set to 750 uA. Discrete n-channel FETs were used for the source follower devices m1 and m2. 2k Ohm resistors was used for Rs, as well as for the resistor Rf in the feedback path of each of TIA1 and TIA2.

Figure 10:
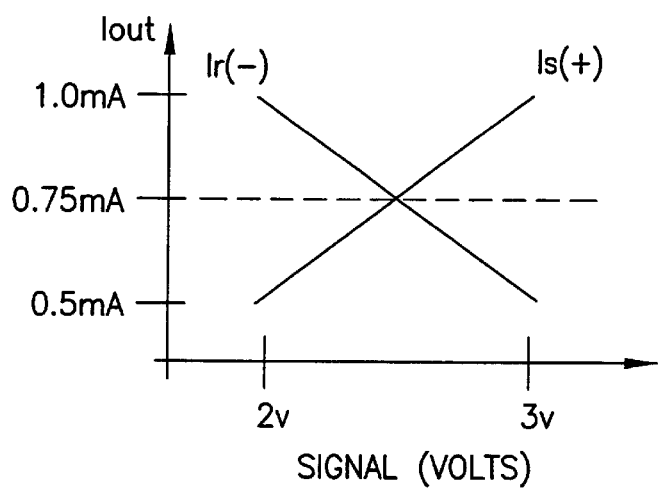
FIG. 10 is a graph showing the differential current output for the breadboard differential current mode output of the amplifier of FIG. 9 for V(Reference=2.5 v), Ip=0.75 mA and Rs=2 k.

FIG. 10 illustrates the behavior of the breadboard circuit 10. For a fixed reference potential and a varying input signal potential the output currents Ir and Is are shown. The current levels cross at the mirror current levels for m4 and m5 when the signal potential is equivalent to the reference potential. As illustrated in FIG. 10 this occurs at 750 uA. Increasing the signal potential results and in an increase in the current Is and a decrease in the current Ir. The graph illustrates the case of the breadboard circuit 10 where the resistor Rs was set to 2 k Ohms and the reference potential (Vr) was made equal to 2.5 v. For these conditions a 2 v input signal potential generates 0.5 mA in the output current Is and 1.0 mA in the output current Ir. At the input signal potential of 3 v an output current of 1.0 mA is generated in Is and 0.5 mA is generated in Ir.

Figure 11:
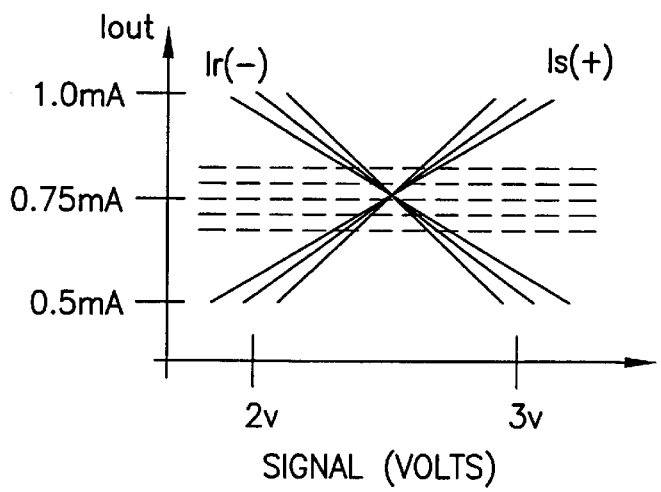
FIG. 11 is a graph showing the differential current output for the differential current mode output amplifier with current mirror, wherein three mirror ratios are shown.

FIG. 11 illustrates that behavior of the current mode output circuit using current mirrors as described in FIG. 7. Here the ratio of the current mirror MOSFETs m6, m7 and m8, m9 can be used to increase or decrease the output currents Is and Ir. The effect of increasing the current mirror ratio causes the output current range of 0.5 mA to 1.0 mA to be realized with a smaller swing of the input signal potential. Similarly, decreasing the mirror ratio causes the output current range of 0.5 mA to 1.0 mA to be realized with a larger swing of the input signal potential. FIG. 11 shows three arbitrary, near unity, mirror ratios for illustrative purposes.

It should be noted that the point at which the currents Is and Ir are equivalent is generated when the signal potential is equivalent to the reference potential.

Figure 12:
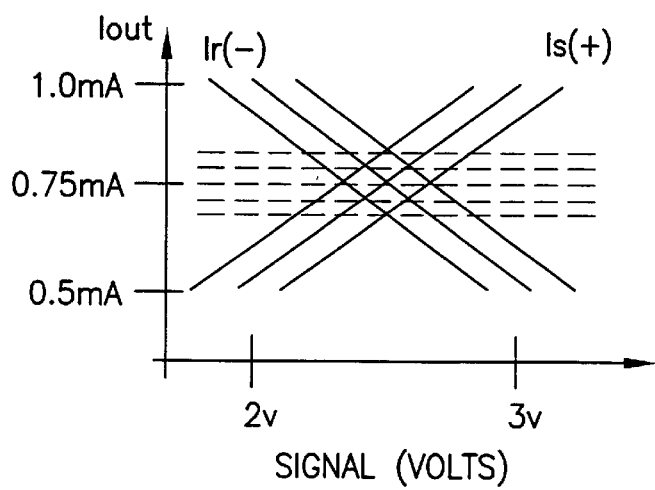
FIG. 12 is a graph showing the differential current output for differential current mode output amplifier showing a reference adjustment.
Figure 13:
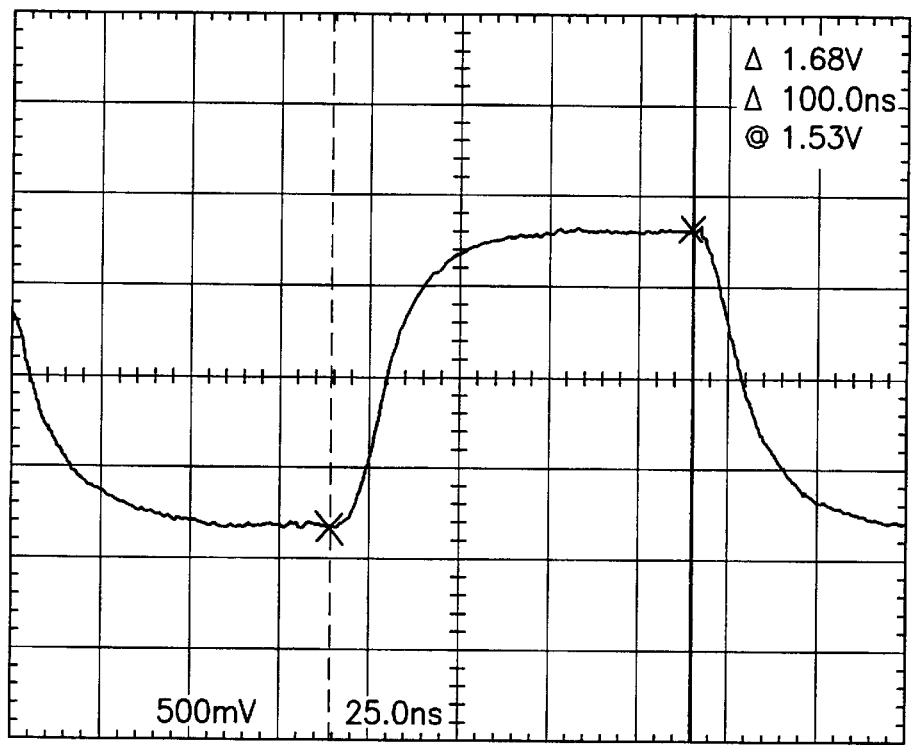
FIGS. 13–16 are each an oscilloscope display of the response of the differential current mode output amplifier breadboard of FIG. 9 to a 10 MHZ, a 11.1 MHz, a 12.5 MHz and a 16 MHz input signal, respectively.
Figure 14:
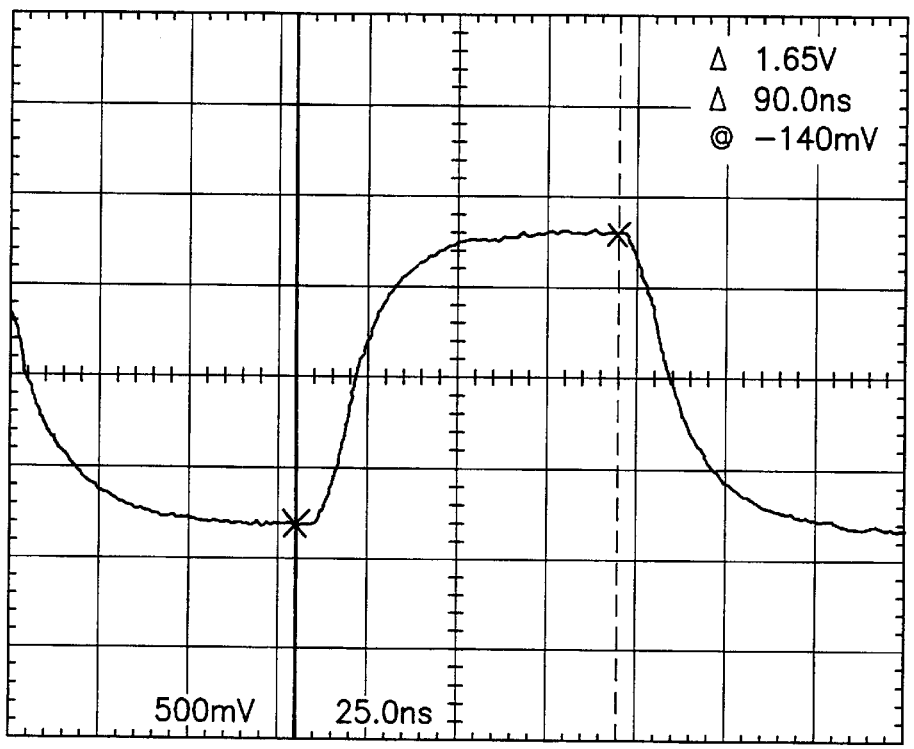
Figure 15:
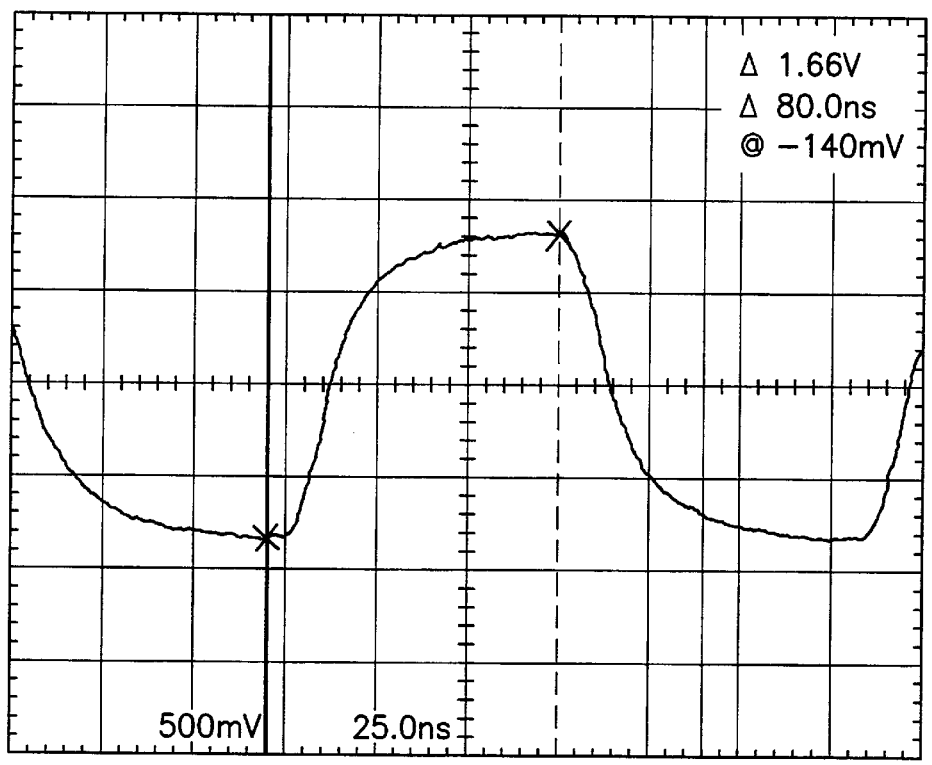
Figure 16:
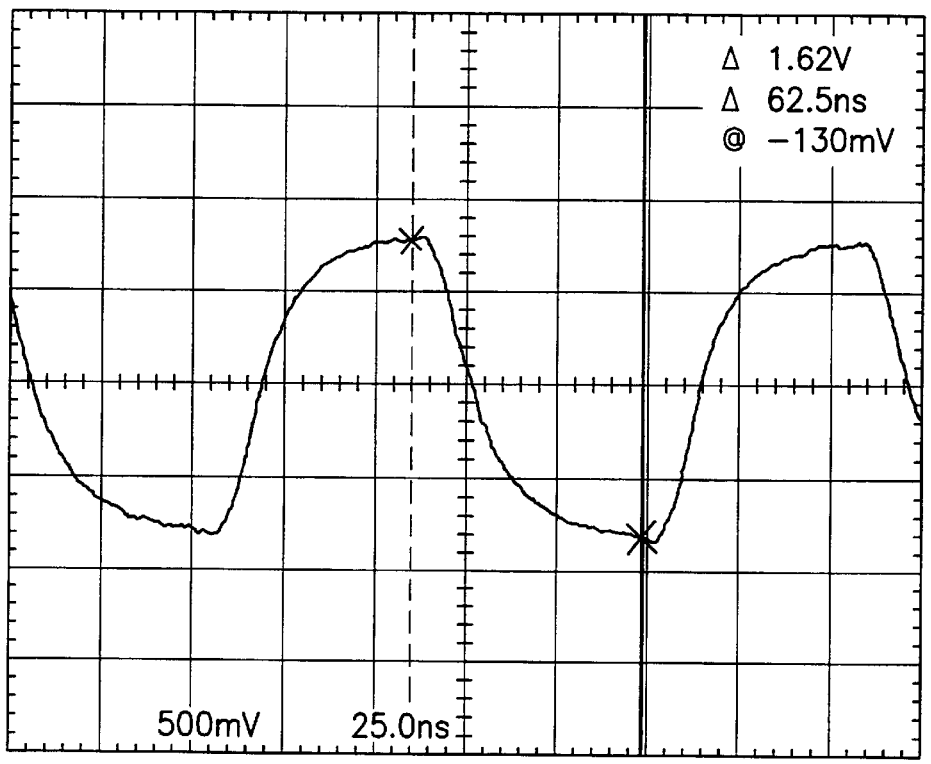

FIG. 12 illustrates the effect of adjusting the reference potential while sweeping the input signal potential. Three reference potential settings are shown. The adjustment of the reference potential allows the differential output current to be adjusted for given signal level. This can be used to advantage when setting the zero signal level for a system.

The breadboard circuit 10 described in FIG. 9 was tested at signal frequencies between 10 MHz and 20 MHz. FIGS. 13–16 show the results of these tests. For these tests a Comlinear CLC-502 op-amp with 2K Ohm feedback resistors (Rf) were used in the TIAs 1 and 2. The breadboard circuit 10 provided adequate settling time to operate at 16 MHz with a power dissipation level lower than most 5 MHz-voltage mode output amplifiers.

The noise model for the differential current mode output circuit 5, 5' is shown in FIG. 17. Noise terms for the current sources, "source follower" drivers, and TIA opamps and feedback resistors are shown. The transfer functions for the noise sources illustrated in FIG. 17 are described in FIG. 18. These transfer functions describe the output-referred noise for each noise term. The noise analysis was performed for the differential current mode output amplifier using current mirrors (see FIGS. 7 and 8).

Figure 21:
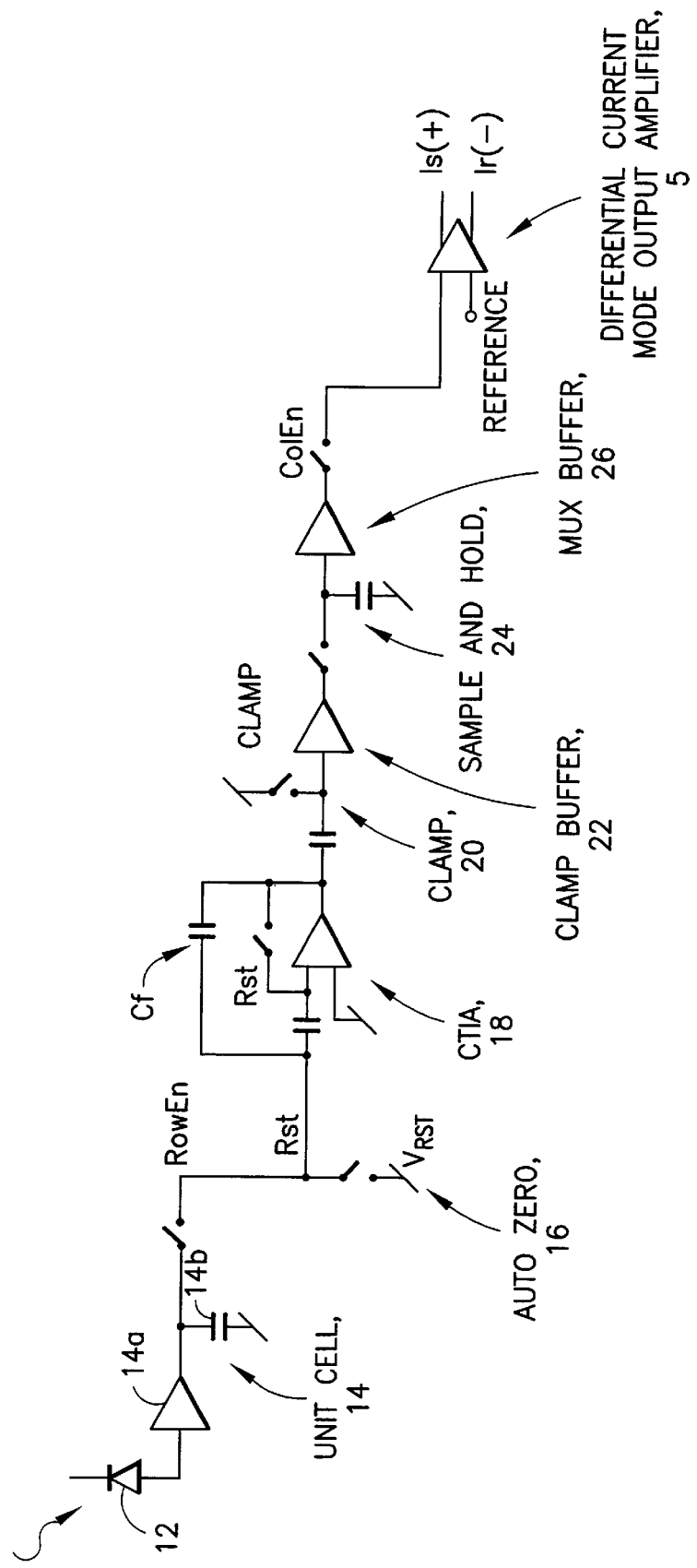
FIG. 21 is a block diagram of circuit components comprising one unit cell signal chain for a FPA using the differential current mode output amplifier in accordance with the teachings of this invention.

The differential current mode output amplifier 5, 5' described above can be used to provide output signals for a wide variety of the electro-optical sensors. FIG. 21 illustrates a block diagram for a single channel of an exemplary electro-optical sensor. The incident radiation sensing detector photovoltaic detector 12 is shown as a p-on-n element. A signal from the detector 12 is initially integrated into a unit cell 14, which includes an amplifier 14a and a capacitance 14b. A RowEn switch to a column-based signal processing chain then enables the signal from the unit cell 14 to enter the column signal processing chain. This chain comprises a number of different circuit functions, including Auto Zero 16, charge transimpedance amplifier (CTIA) 18, clamp 20, clamp buffer 22, sample and hold 24, MUX buffer 26 and, in accordance with this invention, the differential current mode output amplifier 5 (or 5'). Enabling the RowEn switch connects the unit cell integration capacitor 14b to the sensing node of the CTIA 18, and thus performs the sampling process for the unit cell 14. The configuration for the CTIA 18 is shown to be that of an auto zero CTIA, although other configurations could be used as well. The signal output from the CTIA 18 is then clamped, buffered, sampled and held, and finally multiplexed to the differential current mode output amplifier 5 (or 5').

Figure 22:
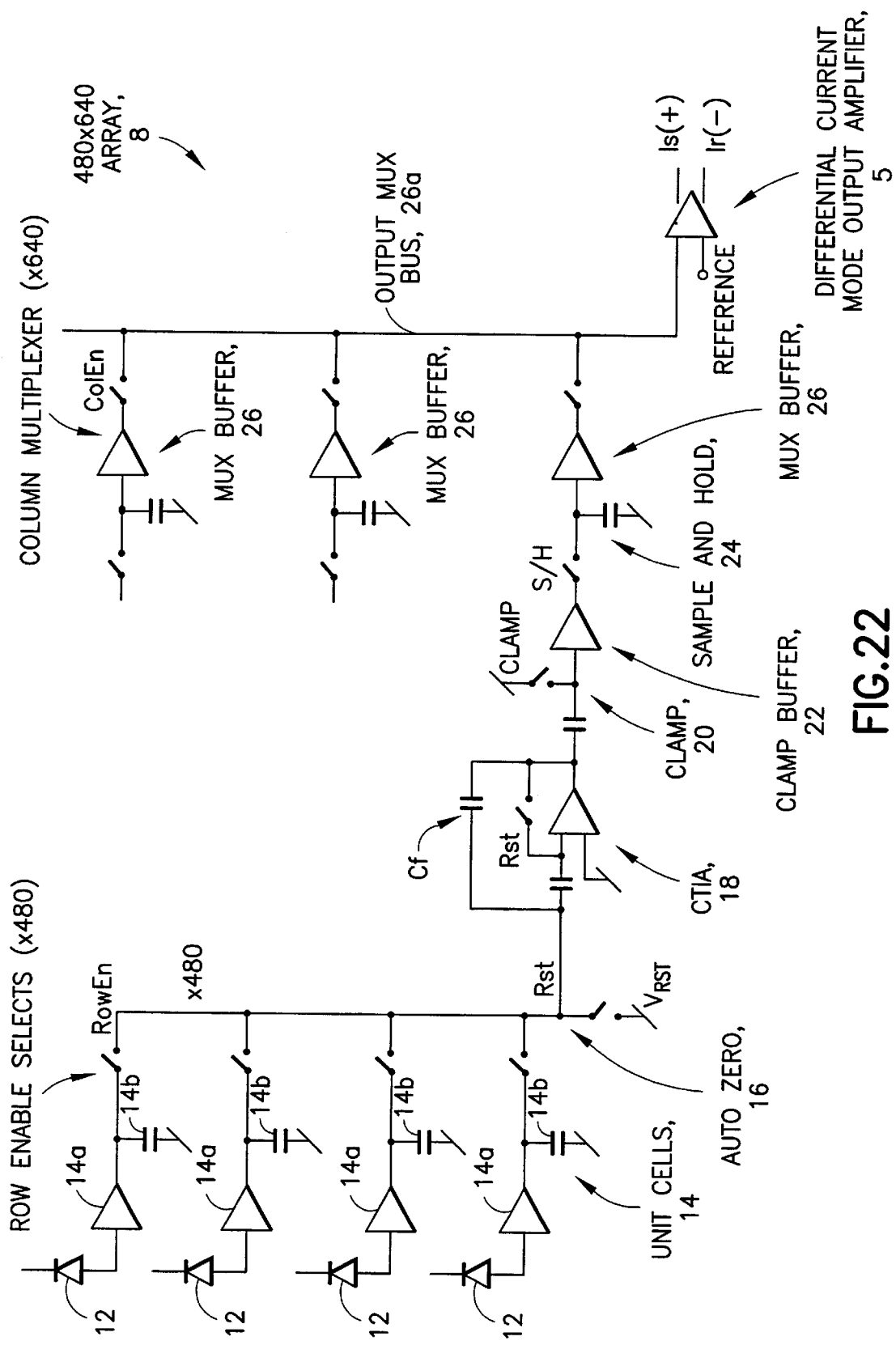
FIG. 22 is a portion of a FPA block diagram showing the signal chain and multiplexing configuration for a single differential current mode output amplifier.
Figure 23:
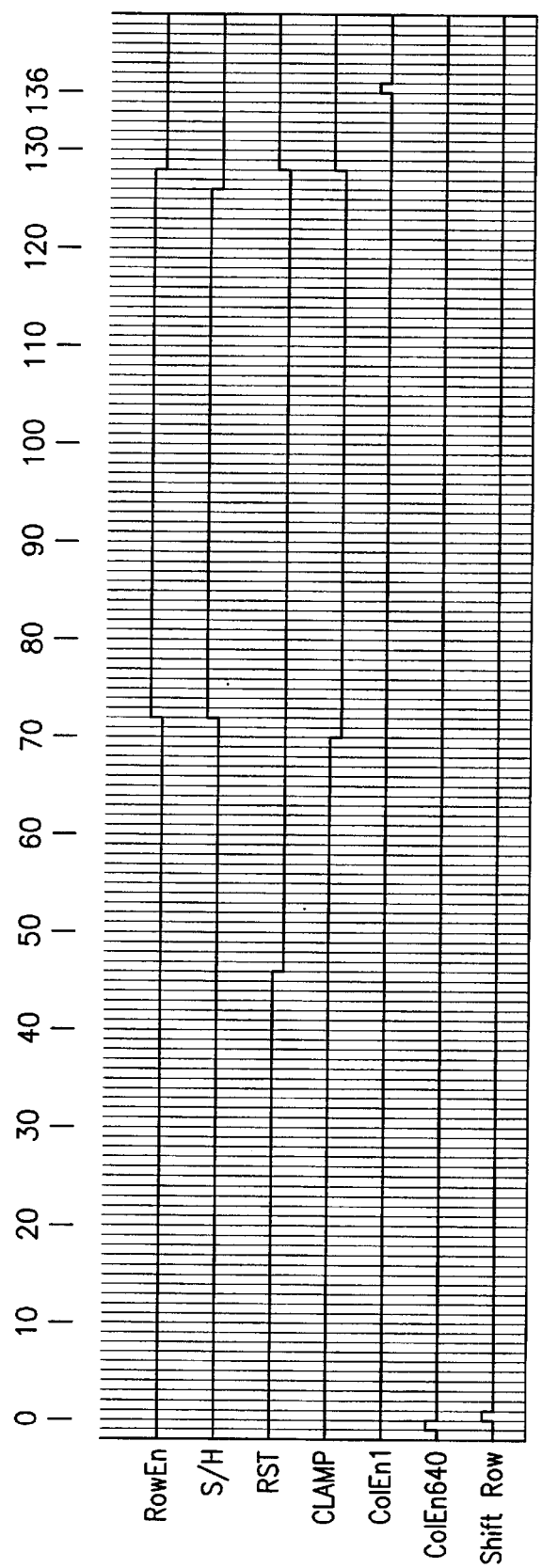
FIG. 23 is a timing diagram for a typical IR-FPA.

FIG. 22 illustrates the signal chain from FIG. 21 for an exemplary 640×480 electro-optical sensor array 8, and should be viewed in conjunction with the timing diagram of FIG. 23. The Row Enable (RowEn) select switches are shown for all 480 instances per column-based signal chain. 640 column signal chains are shown to be multiplexed into a single differential current mode output amplifier 5. The signal detected by the unit cell detectors 14 is integrated in the unit cell capacitors 14b. Enabling with RowEn, in turn, the capacitors 14b to be connected to the input of the auto zero CTIA sensing amplifier 16, 18 allows sensing of the charge from the integration capacitor 14b of each of the 480 rows in turn, at each of the 640 columns. In order to prepare the CTIA 18 to receive the signal from the unit cell capacitor 14b, the CTIA amplifier circuit must be reset. The CTIA amplifier circuit is reset by closing and then opening the reset switch RST. After the CTIA 18 is reset closing RowEn causes the charge responsible for the potential difference between the integrated potential at the capacitor 14b and the potential of Vrst to be integrated across the auto zero CTIA feedback capacitor Cf. As should be apparent to those skilled in the art, the size of the auto zero CTIA feedback capacitor Cf determines the transimpedance of the signal chain from the units cell integration capacitor 14b to the output of the CTIA 18.

Referring to FIG. 23, the auto zero CTIA circuit reset function is performed by the clock RST. From FIG. 23, as well as FIGS. 21 and 22, it can be seen that these clocks become active at clock state 128 for performing the function of resetting the CTIA 18 (RST) and clamping (CLAMP) the auto zero input to a fixed potential. It should be noted that the pattern shown in FIG. 23 is cyclical. Also shown are the clocks ColEn1 and ColEn640.

These clocks show the time locations for the addressing of the columns to the output multiplexing bus 26a of FIG. 22.

Figure 24:
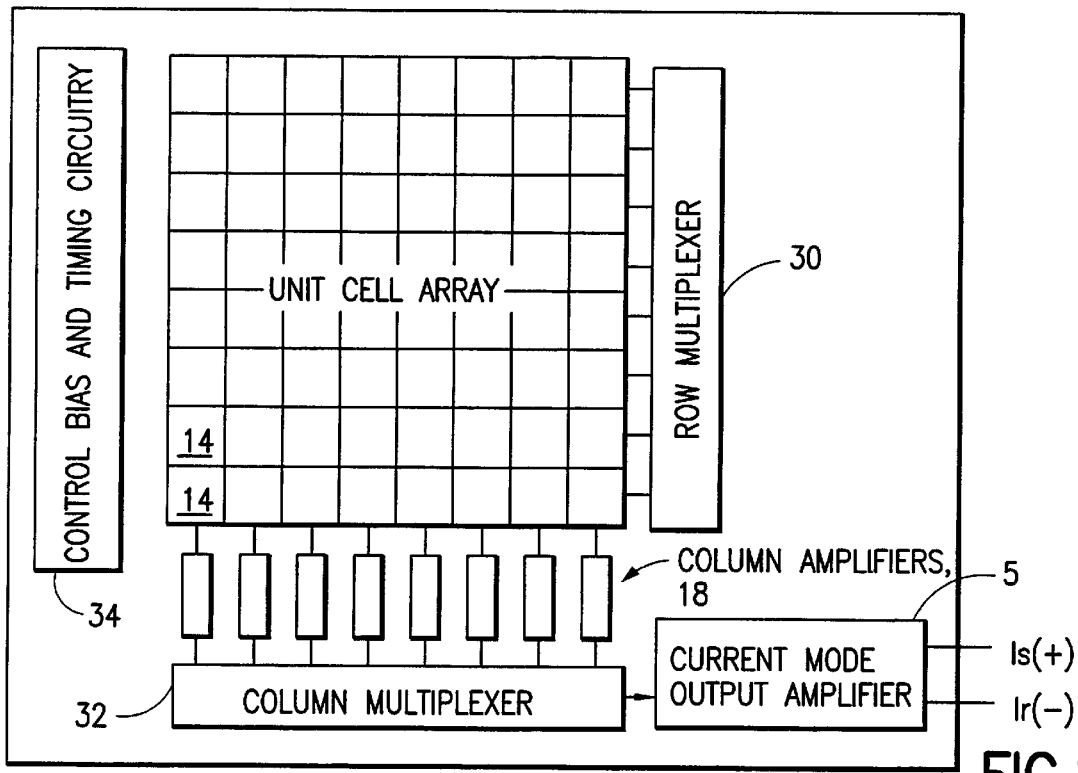
FIG. 24 is a simplified diagram of a 2-dimensional FPA showing a single differential current mode output amplifier.

FIG. 24 shows a block diagram and a top view of the readout integrated circuit (ROIC) containing an embodiment of circuitry described with respect to FIGS. 21–23. Shown in the center of this diagram is an 8×8 array of unit cells 14 for converting incident photons to charge and integrating the charge in the unit cells. A row multiplexer 30 provides the row addressing function and a column multiplexer 32 provides the column addressing function (see also FIGS. 19 and 20, respectively). Control and timing generation circuitry 34 is incorporated for generating bias potentials, bias references, and clocks. An output amplifier block 32a provides output signal drive. As in the embodiment of FIG. 22, a single differential current mode output amplifier 5 is shown for sequentially outputting the column-multiplexed signals.

Figure 25:
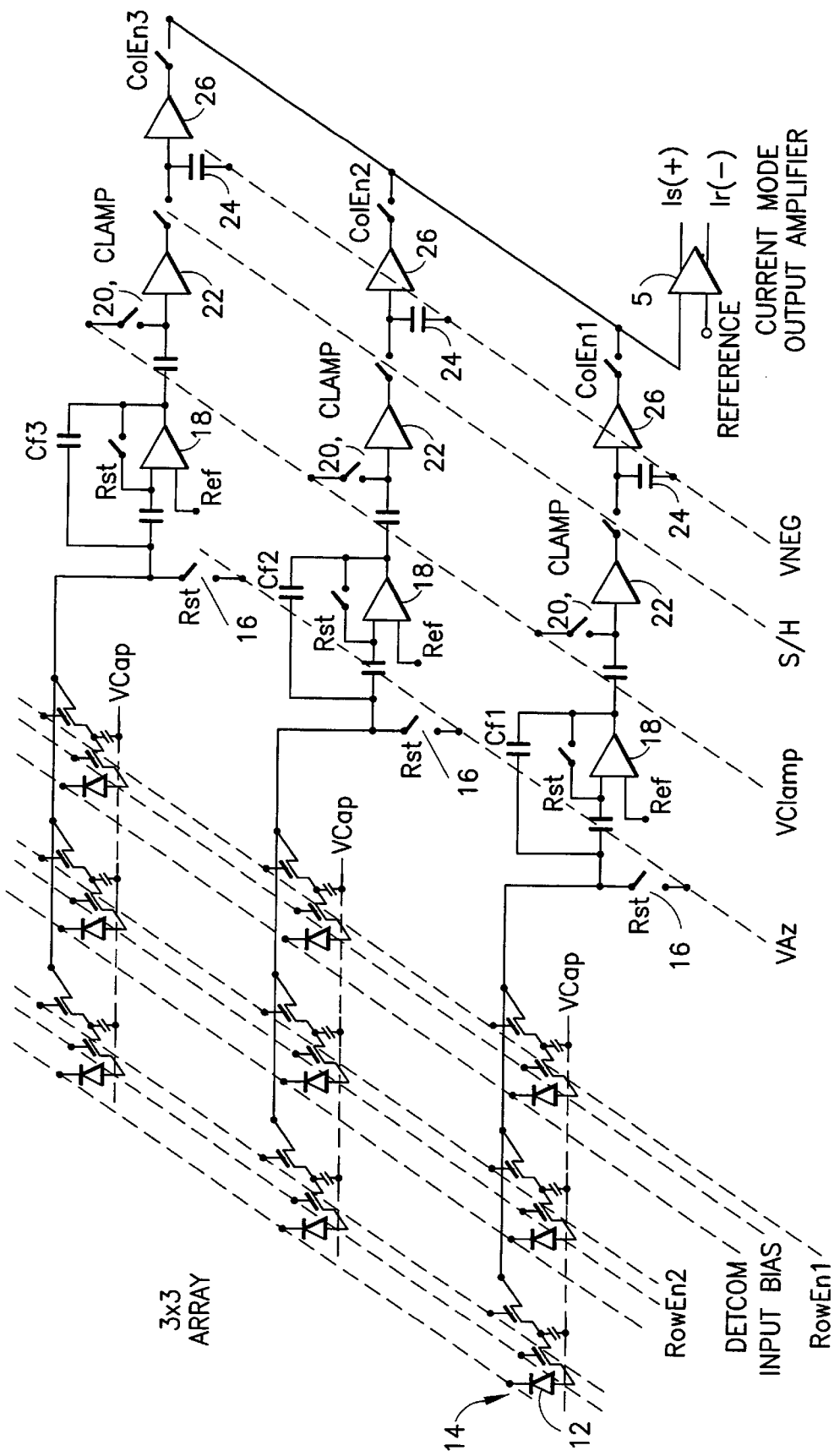
FIG. 25 is another diagram of the 2-dimensional FPA showing the single differential current mode output amplifier.

FIG. 25 shows a perspective view of an exemplary 3×3 unit cell array containing the circuitry described above. Here three unit cells 14 are shown for each column amplifier signal chain. Row enable clocks (RowEn1, RowEn2) are shown to enable one of the three rows to each column CTIA 18 while column enable switches (ColEn1, ColEn2, ColEn3) sequentially couple individual ones of the columns to the current mode output amplifier 5.

Figure 26:
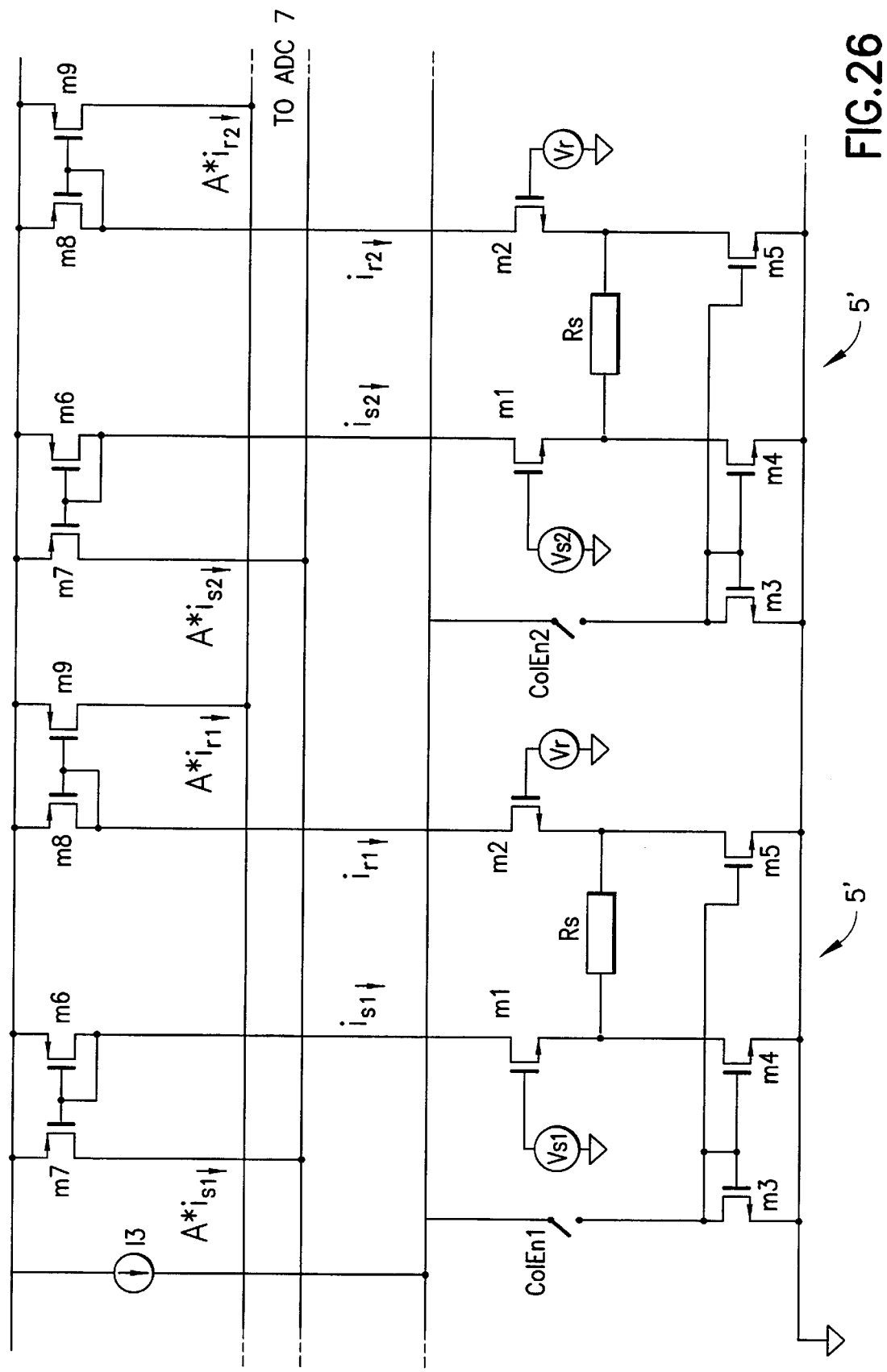
FIG. 26 is an illustration of a differential current mode output amplifier configuration for implementation at the column of the FPA.

FIG. 26 shows the block diagram of another embodiment having a different location of the differential current mode output amplifier 5'. Reference should also be made again to FIG. 8. Here the current mode output is implemented as a differential current mode output amplifier 5' per signal channel column. The input signal potential (Vs) from the sample and hold 24 for each column is provided to the signal input of each corresponding column differential current mode output amplifier 5', and the differential current output lines ($A*i_{sn}$, $A*i_{rn}$) for the amplifiers 5' are shared in common. Signals Vs1 and Vs2 show that the input signal potentials for the differential current mode amplifiers 5' arise from different sources (different ones of the sample and holds 24), while the reference signals Vr are common to all of the amplifiers 5' and thus provides a common reference bias for the differential signals. A shared current source (I3) is used to provide a near constant output current from the column amplifiers, and to allow output switching without interrupting the output current. Switches ColEn1 and ColEn2 are used to direct the current source I3 current into the desired output stage.

Figure 27:
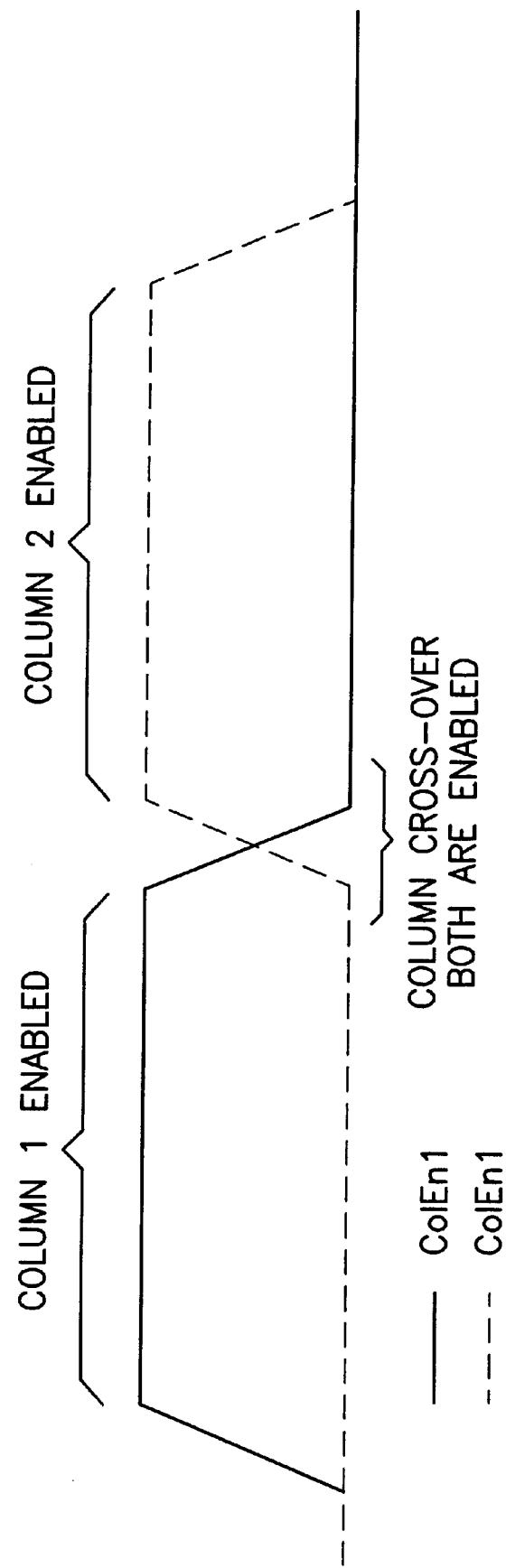
FIG. 27 is a timing diagram showing a column enable cross-over for the column-based differential current mode output amplifier of FIG. 26.

In order to maintain a near constant current in the differential current output lines ($A*i_{sn}$, $A*i_{rn}$), the column addressing circuitry 32 is constructed so as to allow ColEn2 to become active before ColEn1 is allowed to go inactive. The desired column enable signal crossover is illustrated in FIG. 27 for column 1 and column 2. During the transition time between columns 1 and 2 the signals overlap, thereby allowing each amplifier 5' to temporarily share the current source I3 in FIG. 26. This process beneficially enables the mirrored currents to the shared differential output amplifiers 5's to remain substantially constant, and avoids the current transients that would occur if the current source I3 were periodically turned off and on. When ColEn1 is on and ColEn2 is off the current I3 is fully mirrored into the column 1 amplifier 5', allowing the column 1 signal to be output. Similarly, when ColEn2 is on and ColEn1 is off the current I3 is fully mirrored into the column 2 amplifier 5', allowing the column 2 signal to be output. In practice, the overlap between the column enable signals may be only on the order of about 10 nanoseconds.

Figure 28:
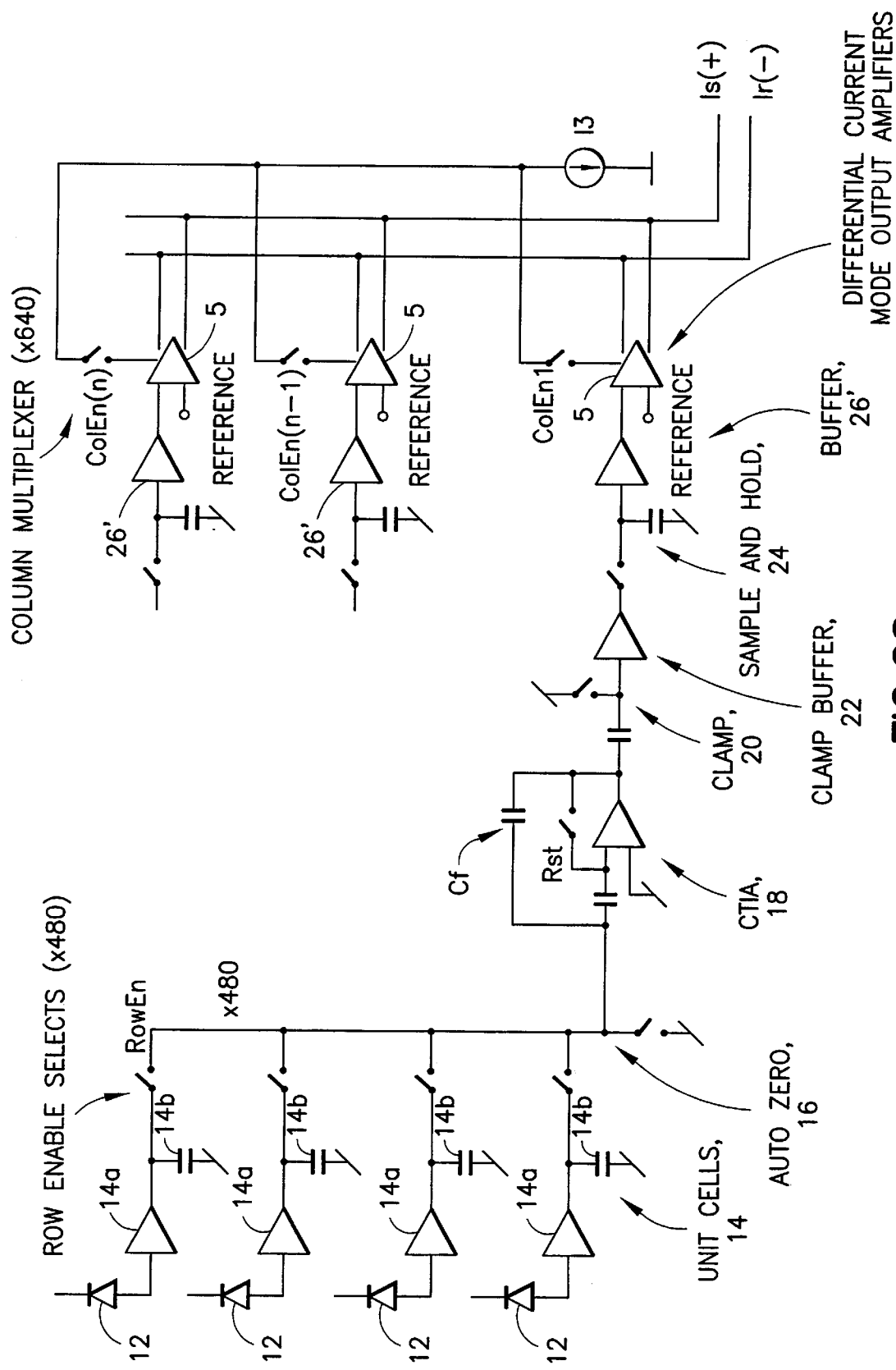
FIG. 28 is a FPA block diagram showing the signal chain and multiplexing configuration for the column-based differential current mode output amplifier.

FIG. 28 is a block diagram for the differential current mode column amplifier per array column configuration discussed above in relation to FIGS. 26 and 27. Here the Is and Ir lines are shared between each of the column differential current output amplifiers 5'. Column addressing signals ColEn1, ColEn(n−1), and ColEn(n) illustrate an array of 1 to n columns. Balanced current switching between the column amplifiers is accomplished as described in FIGS. 26 and 27 by the overlapping of the column enable (ColEn) clocks. The use of the switched differential current mode amplifier 5' per column eliminates the need for the higher power voltage buffer (MUX buffers 26 of FIG. 22) that are required to drive the capacitance of the output MUX bus 26a, at the desired bandwidth, with the column signal to the single output amplifier. Instead, a plurality of per column, lower power, narrower bandwidth buffers 26' can be used instead.

Figure 29:
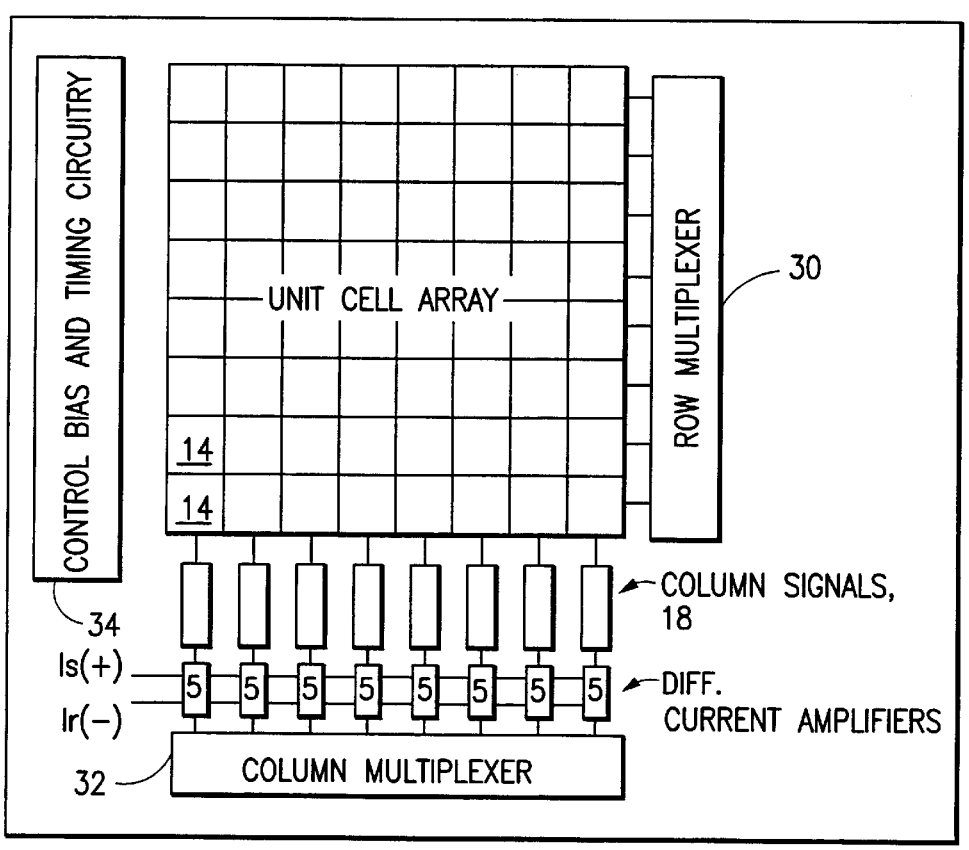
FIG. 29 is a simplified block diagram of a 2-dimensional FPA showing the column-based differential current mode output amplifiers.

A block diagram for the differential current mode amplifier per column configuration of FIG. 28 is shown in FIG. 29. Depicted in the center of the diagram is an exemplary 8×8 array of unit cells 14. As in FIG. 24, the row multiplexer 30 provides the row addressing function and the column multiplexer 32 is shown to provide the column addressing function. The control and timing generation circuitry 34 is provided as before. However, a single differential current output amplifier 5, per column, is shown at the terminus of each column signal chain. In this case the ColEn signals are used to switch the current source I3, as shown in FIG. 28.

Figure 30:
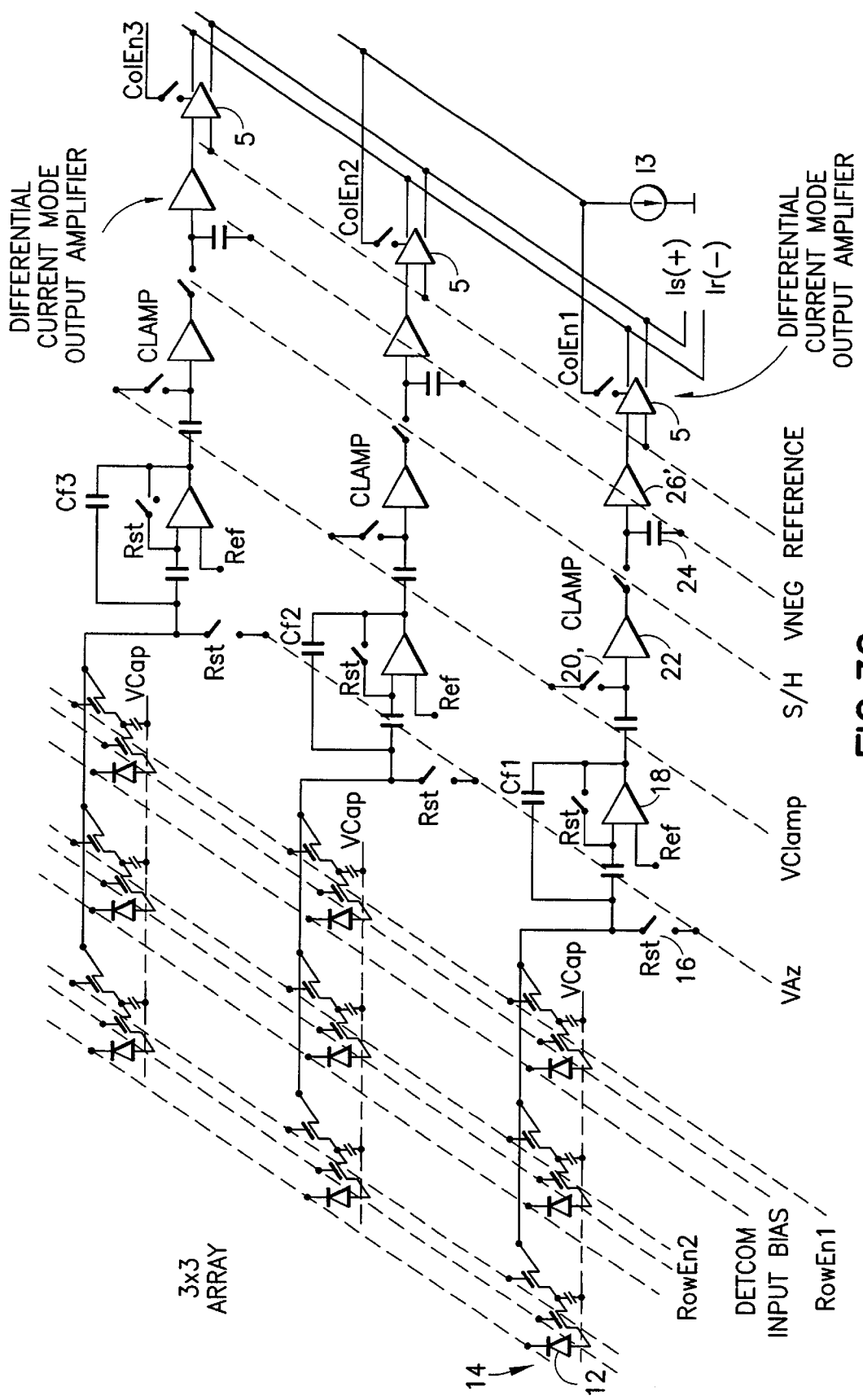
FIG. 30 is an illustration of 2-dimensional FPA with the column-based differential current mode output amplifier.

A perspective view for the 3×3 array of FIG. 28 is shown in FIG. 30. The only significant difference between this Figure and FIG. 25 is the plurality of differential current mode output amplifiers 5 that are located at the terminus of each column signal chain, the Reference (Vr) bus connected in common to the individual ones of the plurality of differential current mode output amplifiers 5, and of course the use of the ColEn clocks (preferably overlapped as in FIG. 27) for selectively connecting I3 to the individual ones of the plurality of differential current mode output amplifiers 5.

Figure 19:
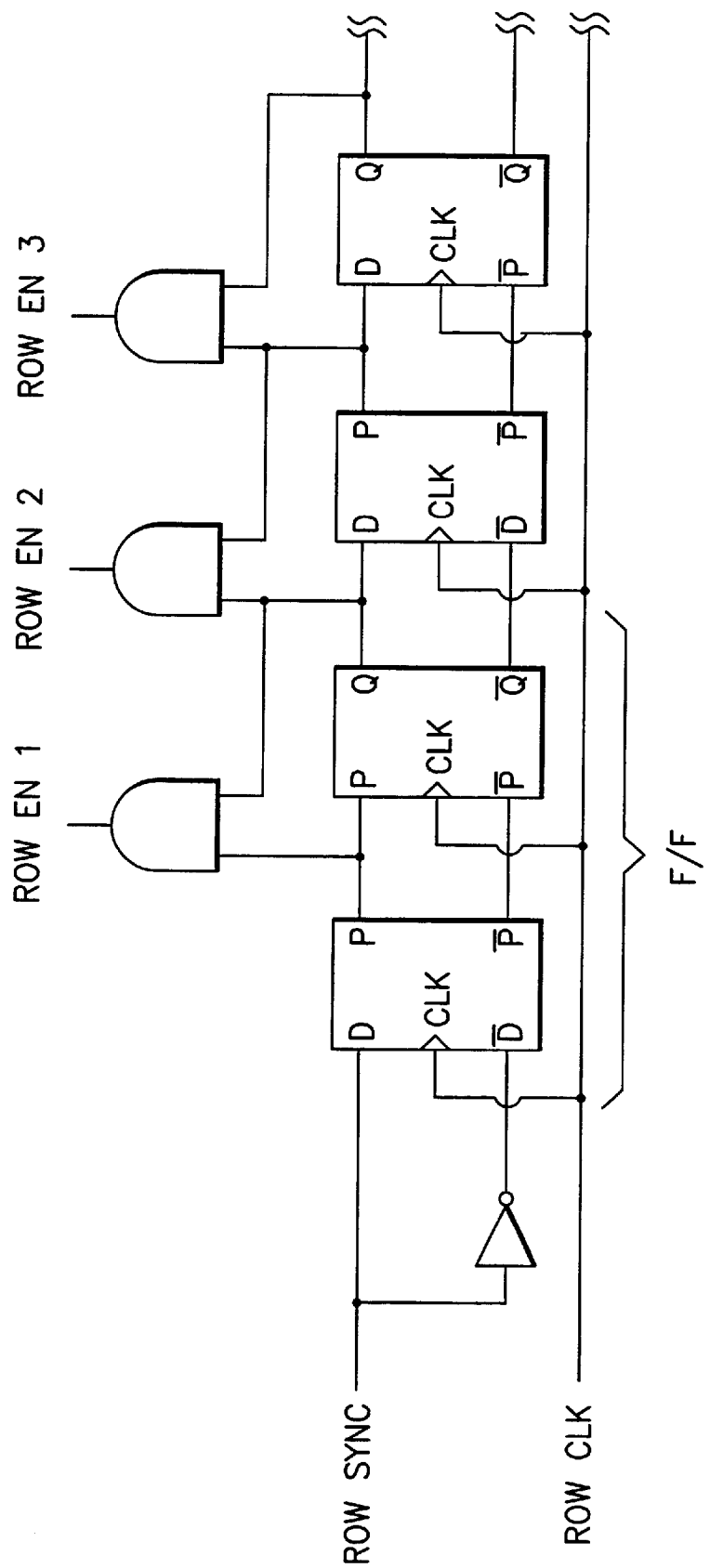
FIG. 19 is a block diagram of a row address multiplexer.
Figure 20:
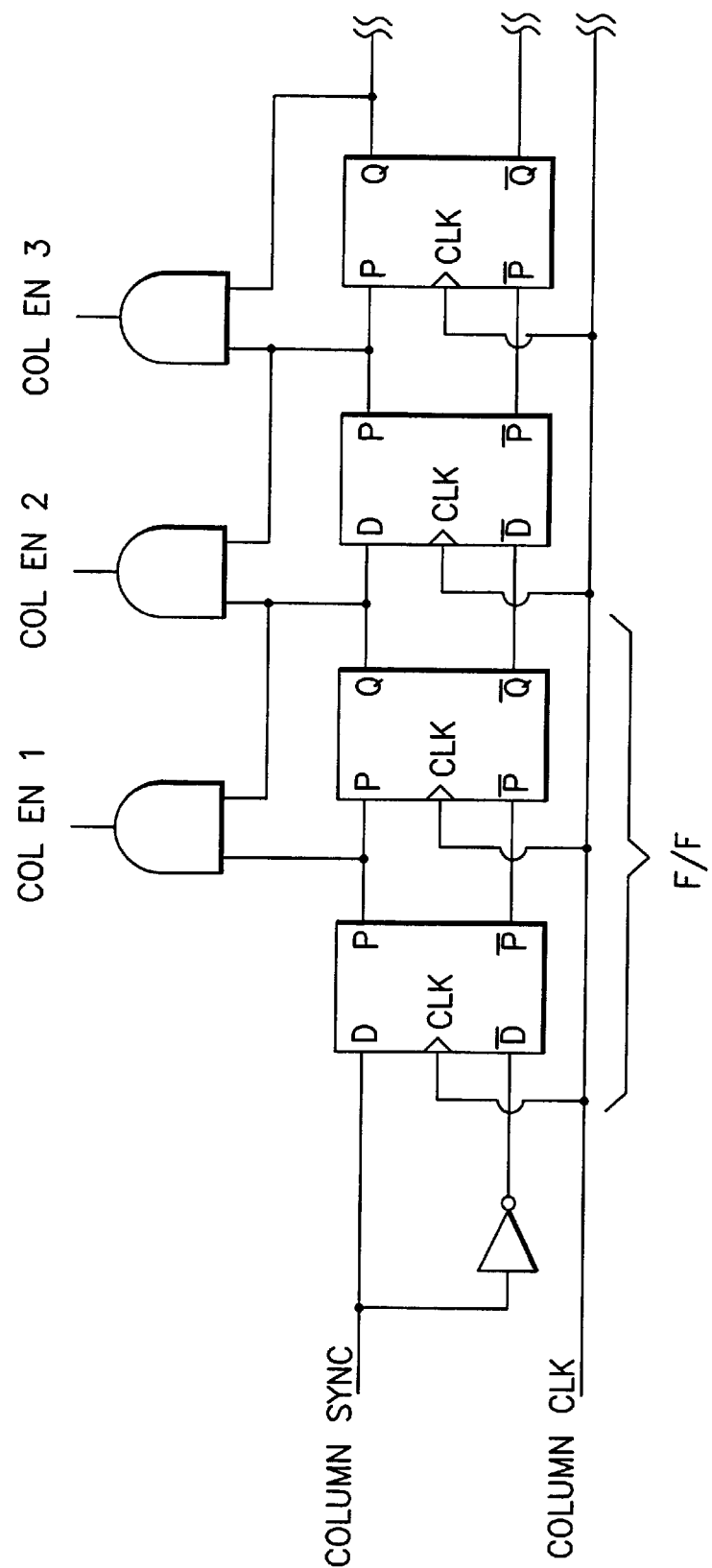
FIG. 20 is a block diagram of a column address multiplexer.

FIGS. 19 and 20 are simplified block diagrams for the row address multiplexer 30 and the column address multiplexer 32 shown in FIGS. 24 and 29. For these circuits a logical 1 state is input into a shift register comprised of D-type flip/flops (F/Fs), with the nominal logic 0 state already present. Transitions of the row clock or column clock perform the function of clocking the logical 1 state down the shift register and thus sequentially enabling the row enable ($RowEn_n$) and column enable ($ColEn_n$) signals. Each D flip/flop can be seen to actually comprise two flip/flops.

While the invention has been particularly shown and described with respect to preferred embodiments thereof, it will be understood by those skilled in the art that changes in form and details may be made therein without departing from the scope and spirit of the invention.

What is claimed is:

1. A differential current mode amplifier circuit, comprising:
   a first circuit leg comprising a first current source providing a current I1 coupled in series with a first transistor at a first circuit node, said first transistor having a control terminal for coupling to an input signal potential (Vs), said first circuit leg outputting a first output current;
   a second circuit leg comprising a second current source providing a current I2 coupled in series with a second transistor at a second circuit node, said second transistor having a control terminal for coupling to an input reference potential (Vr), said second circuit leg outputting a second output current; and
   a resistance (Rs) coupled between said first circuit leg and said second circuit leg at said first circuit node and said second node.

2. A differential current mode amplifier circuit as in claim 1, wherein the current flow through Rs is proportional to a difference between Vs and Vr.

3. A differential current mode amplifier circuit as in claim 1, wherein the current flow through Rs (I(Rs)) is described by:

$$I(Rs)=(Vs-Vr)/Rs;$$

wherein the current flow through said first transistor (Is) is equal to (I1−I(Rs)); and wherein the current flow through said second transistor (Ir) is equal to (I2+I(Rs)).

4. A differential current mode amplifier circuit as in claim 3, wherein Is is input to a first transimpedance amplifier, wherein Ir is input to a second transimpedance amplifier, and wherein a voltage output of said first transimpedance amplifier and a voltage output of said second transimpedance amplifier are input to a differential analog to digital converter which outputs a digital indication of the magnitude of Vs.

5. A differential current mode amplifier circuit as in claim 1, wherein said first and second current sources are each a constant current source comprised of a transistor having a control terminal coupled to an output of a current mirror.

6. A differential current mode amplifier circuit, comprising:

a first circuit leg comprising a first current source providing a current I1 coupled in series with a first MOSFET at a first circuit node, said first MOSFET having a gate terminal for coupling to an input signal potential (Vs) derived from an output of an electromagnetic radiation sensor, said first circuit leg being coupled to a first mirrored circuit leg for outputting a first output current A*Is, where A is a multiplication factor and Is is the current flow though said first MOSFET;

a second circuit leg comprising a second current source providing a current I2 coupled in series with a second MOSFET at a second circuit node, said second MOSFET having a gate terminal for coupling to an input reference potential (Vr), said second circuit leg being coupled to a second mirrored circuit leg for outputting a second output current A*Ir, where Ir is the current flow though said second MOSFET; and a resistance (Rs) coupled between said first circuit leg and said second circuit leg at said first circuit node and said second node such that the current flow through Rs (I(Rs)) is proportional to a difference between Vs and Vr and is described by:

$$I(Rs)=(Vs-Vr)/Rs;$$

wherein Is is equal to (I1−I(Rs)); and wherein Ir is equal to (I2+I(Rs)).

7. A differential current mode amplifier circuit as in claim 6, wherein A*Is is input to a first transimpedance amplifier, wherein A*Ir is input to a second transimpedance amplifier, and wherein a voltage output of said first transimpedance amplifier and a voltage output of said second transimpedance amplifier are input to a differential analog to digital converter which outputs a digital indication of the magnitude of Vs.

8. A differential current mode amplifier circuit as in claim 6, wherein said first and second current sources are each a constant current source comprised of a MOSFET having a gate terminal coupled to an output of a current mirror.

9. A differential current mode amplifier circuit as in claim 6, wherein said first circuit leg and said second circuit leg are each comprised of a current mirror for generating A*Is and A*Ir from Is and Ir, respectively.

10. A differential current mode amplifier circuit as in claim 6, wherein said electromagnetic radiation sensor is part of a two dimensional array having N rows and M columns of electromagnetic radiation sensors disposed on a first substrate, wherein there is one of said differential current mode amplifier circuits disposed on a second substrate, and wherein Vs is derived sequentially from individual ones of said N rows being multiplexed into one of said M columns, and individual ones of said M columns being multiplexed into said gate of said first MOSFET through an output bus.

11. A differential current mode amplifier circuit as in claim 6, wherein said electromagnetic radiation sensor is part of a two dimensional array having N rows and M columns of electromagnetic radiation sensors disposed on a first substrate, wherein there are M ones of said differential current mode amplifier circuits disposed on a second substrate, and wherein Vs is derived sequentially from individual ones of said N rows being multiplexed into one of said M columns, and individual ones of said M columns being multiplexed to an output bus via said gate of said first MOSFET of an associated individual one of said M differential current mode amplifier circuits.

12. A differential current mode amplifier circuit as in claim 11, wherein said output bus is comprised of a first signal line that is coupled in common to a first output of each of said M differential current mode amplifier circuits for outputting A*Is, and wherein said output bus is further comprised of a second signal line that is coupled in common to a second output of each of said M differential current mode amplifier circuits for outputting A*Ir.

13. A differential current mode amplifier circuit as in claim 11, wherein said columns are multiplexed by sequentially activating control signals that are coupled to said first and second current sources of individual ones of said M differential current mode amplifier circuits for turning said first and second current sources on and off, and wherein said control signals are activated so as to overlap such that said first and second current sources of one of said differential current mode amplifier circuits are turned on before said first and second current sources of another one of said differential current mode amplifier circuits are turned off.

14. An IR-FPA, comprising:

an array of IR responsive photodetectors; and a readout integrated circuit (ROIC) coupled to said array, said ROIC comprising at least one differential current mode amplifier output circuit having a first input for inputting a first potential Vs representing, at a particular time, a signal output from one of said IR responsive photodetectors and a second input for inputting a second potential Vr representing a reference potential, said at least one differential current mode amplifier output circuit outputting first and second currents, wherein a difference between said first and second currents is indicative of a difference between Vs and Vr.

15. A method of operating an electro-optical sensor array, comprising steps of:

converting incident photons to charge and integrating the charge in unit cells of the sensor array;

sequentially sampling the integrated charge from the unit cells and converting the sampled charge to a signal potential Vs; and applying Vs and a reference potential Vr to a differential current mode amplifier output circuit and outputting first and second currents, wherein a difference between the first and second currents is indicative of a difference between Vs and Vr.

16. A radiation sensor unit, comprising:

an electro-optical sensor array for converting incident photons to charge and for integrating the charge in unit cells of the sensor array;

a multi-channel readout circuit for sequentially sampling the integrated charge from the unit cells and comprising, in each channel, an amplifier circuit for converting the sampled charge to a signal potential Vs; and a channel multiplexer for sequentially applying Vs from a plurality of channels to an input of a differential current mode amplifier output circuit, said differential current mode amplifier output circuit being responsive to Vs and to a reference potential Vr for outputting first and second currents, wherein a difference between said first and second currents is indicative of a difference between Vs and Vr.

17. A radiation sensor unit as in claim 16, wherein said amplifier circuit is comprised of a charge transimpedance amplifier (CTIA).

18. A radiation sensor unit as in claim 16, wherein said amplifier circuit is comprised of an auto-zero charge transimpedance amplifier (CTIA).

19. A radiation sensor unit, comprising:

an electro-optical sensor array for converting incident electromagnetic radiation to charge and for integrating the charge in unit cells of the sensor array;

a multi-channel readout circuit for sequentially sampling the integrated charge from the unit cells and comprising, in each channel, an amplifier circuit for converting the sampled charge to a signal potential Vs; and each channel further comprises a differential current mode amplifier output circuit, said differential current mode amplifier output circuit being responsive to Vs output from the associated amplifier circuit and to a reference potential Vr for outputting first and second currents, wherein a difference between said first and second currents is indicative of a difference between Vs and Vr.

20. A radiation sensor unit as in claim 19, wherein said amplifier circuit is comprised of a charge transimpedance amplifier (CTIA).

\* \* \* \* \*